United States Patent
Turner et al.

(10) Patent No.: US 11,095,311 B2
(45) Date of Patent: Aug. 17, 2021

(54) QUANTIZATION CODEWORD SELECTION FOR LOW COST PARITY CHECKING

(71) Applicant: QUALCOMM Incorporated, San Diego, CA (US)

(72) Inventors: Richard Turner, Belfast (GB); Laurent Wojcieszak, Belfast (GB); Joel Linsky, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 30 days.

(21) Appl. No.: 16/698,031

(22) Filed: Nov. 27, 2019

(65) Prior Publication Data
US 2021/0159917 A1 May 27, 2021

(51) Int. Cl.
*H03M 13/15* (2006.01)
*H03M 13/00* (2006.01)

(52) U.S. Cl.
CPC ... *H03M 13/1575* (2013.01); *H03M 13/6502* (2013.01)

(58) Field of Classification Search
CPC ............ H03M 13/1575; H03M 13/6502
See application file for complete search history.

(56) References Cited

U.S. PATENT DOCUMENTS

| | | | | |
|---|---|---|---|---|
| 5,778,100 | A * | 7/1998 | Chen | H04N 19/61 348/700 |
| 5,828,677 | A * | 10/1998 | Sayeed | H04L 1/0068 714/774 |
| 7,599,840 | B2 * | 10/2009 | Mehrotra | G10L 19/0017 341/67 |
| 8,907,823 | B2 * | 12/2014 | Marpe | H03M 7/42 341/107 |
| 10,419,017 | B2 * | 9/2019 | Marpe | H03M 7/40 |
| 10,727,858 | B2 * | 7/2020 | Turner | G10L 19/005 |
| 10,735,734 | B2 * | 8/2020 | Fuchs | H04N 19/184 |
| 2011/0103445 | A1 * | 5/2011 | Jax | H04N 19/30 375/224 |
| 2020/0304146 | A1 * | 9/2020 | Stenstrom | H03M 7/4093 |

OTHER PUBLICATIONS

Kedarnath J. Balakrishnan, Relationship Between Entropy and Test Data Compression, Feb. 2007, IEEE Transactions on Computer-Aided Design of Integrated Circuits and Systems, vol. 26, No. 2 (Year: 2007).*

* cited by examiner

*Primary Examiner* — Albert Decady
*Assistant Examiner* — Jean-Richard Thelemaque
(74) *Attorney, Agent, or Firm* — Holland & Hart LLP

(57) ABSTRACT

Methods, systems, and devices for wireless communications are described. The described techniques provide for generating, by an encoding device, one or more entropy symbols, the length of which changes responsive to errors, stacking the entropy symbols into fixed intervals, and selecting a parity bit. The encoding device may divide entropy symbols that are longer than the fixed interval duration and stack the excess portions of the long entropy symbols with shorter entropy symbols in other intervals. The encoding device may transmit the slacked data packet according to the stacking. A decoding device may receive the data packet, identify the locations of the entropy symbols and the selected parity bit, check the parity of each entropy symbol, identify error bits based on the locations of the entropy symbols within multiple fixed intervals, and may correct error bits based on the stacked intervals, the parity bit, and an error mask.

20 Claims, 15 Drawing Sheets

Quantization band 410-a

Quantization Band 410-b

Quantization Band 410-c

Quantization Band 410-d

400

QUANTIZATION CODEWORD SELECTION FOR LOW COST PARITY CHECKING

FIELD OF TECHNOLOGY

The following relates generally to wireless communications and more specifically to quantization codeword selection for low cost parity checking.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform spread orthogonal frequency division multiplexing (DFT-S-OFDM). A wireless multiple-access communications system may include one or more base stations or one or more network access nodes, each simultaneously supporting communication for multiple communication devices, which may be otherwise known as user equipment (UE). In some examples of wireless communication, a transmitting device may encode and send data signals (e.g., audio data, visual data, or the like) to a receiving device. Data packets may be vulnerable to errors (e.g., due to local interference).

SUMMARY

The described techniques relate to improved methods, systems, devices, and apparatuses that support quantization codeword selection for low cost parity checking. Generally, the described techniques provide for generating, by an encoding device, entropy symbols for each quantization band of a plurality of quantization bands, where the length of at least one of the entropy symbols changes responsive to one or more encoding or decoding errors. The encoding device may stack the entropy symbols into fixed intervals, and select a bit (e.g., designate a least significant bit having a smallest impact) as a parity bit, and may divide entropy symbols that are longer than the fixed interval duration and stack the excess portions of the longer entropy symbols with shorter entropy symbols in other intervals. The encoding device may transmit the stacked data packet according to the stacking. A decoding device may receive the data packet, identify the locations of the entropy symbols and the selected parity bit, check the parity of each entropy symbol, identify error bits based on the locations of the entropy symbols within multiple fixed intervals and the parity check, and may correct error bits based on the stacked intervals, the parity bit, and an error mask.

DETAILED DESCRIPTION

In some examples of wireless communication, a transmitting device may encode and send data signals (e.g., audio data, visual data, or the like) to a receiving device. Data packets may be vulnerable to errors (e.g., due to local interference). In non-streaming contexts, the source device may implement a packet retransmission scheme by which to retransmit lost or corrupt (e.g., due to errors as a result of interference, encoding, or decoding) packets. However, in the streaming context, which is often sent via a low latency wireless connection in certain contexts, like gaming, video teleconferences, audio teleconferences, etc., there often is insufficient time to retransmit lost or corrupt packets. For example, some low latency audio streaming may require packets to be sent every 7.5 ms to 10 ms. The timing constraints may limit the number of retries that may be attempted between packets, and a receiving device may decode one or more packets that contain bit errors, instead of requesting retries. One method for addressing bit errors may be to use forward error correction (FEC) (such as ReedSolomon or Viterbi). However, such methods may be costly because each packet may include additional overhead. In some examples, parity bits may be used to avoid errors, but each parity bit may be associated with an additional cost (e.g., 6 dB per parity bit).

Error resilience may be improved using compression tools, instead of adding additional parity bits (e.g., of a forward error correction (FEC) procedure). A transmitting device may control the parity of a concatenation of a group data symbols with interval based error resilience. That is, a transmitting device may introduce a low-cost error to a data packet by designating a low-cost bit as a parity bit. The transmitting device may also allocate portions of long data symbols across multiple fixed intervals of a data packet, and may encode the symbols such that an error in a data symbol will extend to another interval. Thus, intervals may be used to cross check parity of other intervals (e.g., due to the allocation of the longer symbols to multiple intervals and the encoding of the data symbols). Controlling parity of a concatenation of a group of data symbols using compression tools (e.g., entropy encoders and error resilience encoders as described herein) may produce a robust bit stream (e.g., data packet) that may correct itself at a cost that is lower than the cost of introducing additional parity bits to the data stream.

Aspects of the disclosure are initially described in the context of wireless communications systems. Aspects of the disclosure are further illustrated by and described with reference to signal encoders, bit selection schemes, interval packing schemes, and data packets. Aspects of the disclosure are further illustrated by and described with reference to apparatus diagrams, system diagrams, and flowcharts that relate to quantization codeword selection for low cost parity checking.

Figure 1:
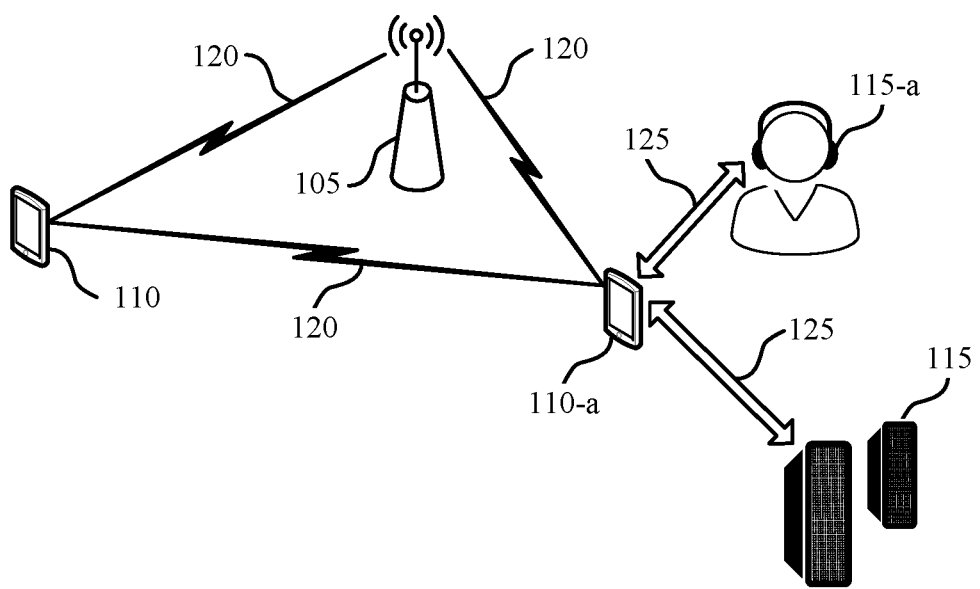
FIG. 1 illustrates an example of a signal processing system that supports quantization codeword selection for low cost parity checking in accordance with aspects of the present disclosure.

FIG. 1 illustrates an example of a wireless communications system 100 that supports quantization codeword selection for low cost parity checking in accordance with aspects of the present disclosure. In some examples, the wireless communications system 100 may include or refer to a wireless personal area network (PAN), a wireless local area network (WLAN), a Wi-Fi network) configured in accordance with various aspects of the present disclosure. The wireless communications system 100 may include an access point (AP) 105, devices 110 (e.g., which may be referred to as source devices, master devices, etc.), and paired devices 115 (e.g., which may be referred to as sink devices, slave devices, etc.) implementing WLAN communications (e.g., Wi-Fi communications) and/or Bluetooth communications. For example, devices 110 may include cell phones, user equipment (UEs), wireless stations (STAs), mobile stations, personal digital assistant (PDAs), other handheld devices, netbooks, notebook computers, tablet computers, laptops, or some other suitable terminology. Paired devices 115 may include Bluetooth-enabled devices capable of pairing with other Bluetooth-enabled devices (e.g., such as devices 110), which may include wireless audio devices (e.g., headsets, earbuds, speakers, ear pieces, headphones), display devices (e.g., TVs, computer monitors), microphones, meters, valves, etc.

Bluetooth communications may refer to a short-range communication protocol and may be used to connect and exchange information between devices 110 and paired devices 115 (e.g., between mobile phones, computers, digital cameras, wireless headsets, speakers, keyboards, mice or other input peripherals, and similar devices). Bluetooth systems (e.g., aspects of wireless communications system 100) may be organized using a master-slave relationship employing a time-division duplex protocol having, for example, defined time slots of 625 mu seconds, in which transmission alternates between the master device (e.g., a device 110) and one or more slave devices (e.g., paired devices 115). In some examples, a device 110 may generally refer to a master device, and a paired device 115 may refer to a slave device in the wireless communications system 100. As such, in some examples, a device may be referred to as either a device 110 or a paired device 115 based on the Bluetooth role configuration of the device. That is, designation of a device as either a device 110 or a paired device 115 may not necessarily indicate a distinction in device capability, but rather may refer to or indicate roles held by the device in the wireless communications system 100. Generally, device 110 may refer to a wireless communication device capable of wirelessly exchanging data signals with another device (e.g., a paired device 115), and paired device 115 may refer to a device operating in a slave role, or to a short-range wireless communication device capable of exchanging data signals with the device 110 (e.g., using Bluetooth communication protocols).

A Bluetooth-enabled device may be compatible with certain Bluetooth profiles to use desired services. A Bluetooth profile may refer to a specification regarding an aspect of Bluetooth-based wireless communications between devices. That is, a profile specification may refer to a set of instructions for using the Bluetooth protocol stack in a certain way, and may include information such as suggested user interface formats, particular options and parameters at each layer of the Bluetooth protocol stack, etc. For example, a Bluetooth specification may include various profiles that define the behavior associated with each communication endpoint to implement a specific use case. Profiles may thus generally be defined according to a protocol stack that promotes and allows interoperability between endpoint devices from different manufacturers through enabling applications to discover and use services that other nearby Bluetooth-enabled devices may be offering. The Bluetooth specification defines device role pairs (e.g., roles for a device 110 and a paired device 115) that together form a single use case called a profile (e.g., for communications between the device 110 and the paired device 115). One example profile defined in the Bluetooth specification is the Handsfree Profile (HFP) for voice telephony, in which one device (e.g., a device 110) implements an Audio Gateway (AG) role and the other device (e.g., a paired device 115) implements a Handsfree (HF) device role. Another example is the Advanced Audio Distribution Profile (A2DP) for high-quality audio streaming, in which one device (e.g., device 110) implements an audio source device (SRC) role and another device (e.g., paired device 115) implements an audio sink device (SNK) role.

For a commercial Bluetooth-enabled device that implements one role in a profile to function properly, another device that implements the corresponding role may be present within the radio range of the first device. For example, in order for an HF device such as a Bluetooth headset to function according to the Handsfree Profile, a device implementing the AG role (e.g., a cell phone) may have to be present within radio range. Likewise, in order to stream high-quality mono or stereo audio according to the A2DP, a device implementing the SNK role (e.g., Bluetooth headphones or Bluetooth speakers) may have to be within radio range of a device implementing the SRC role (e.g., a stereo music player).

The Bluetooth specification defines a layered data transport architecture and various protocols and procedures to handle data communicated between two devices that implement a particular profile use case. For example, various logical links are available to support different application data transport requirements, with each logical link associated with a logical transport having certain characteristics (e.g., flow control, acknowledgement mechanisms, repeat mechanisms, sequence numbering, scheduling behavior, etc.). The Bluetooth protocol stack may be split in two parts: a controller stack including the timing critical radio interface, and a host stack handling high level data. The controller stack may be generally implemented in a low cost silicon device including a Bluetooth radio and a microprocessor. The controller stack may be responsible for setting up connection links 125 such as asynchronous connectionless (ACL) links, (or ACL connections), synchronous connection orientated (SCO) links (or SCO connections), extended synchronous connection-oriented (eSCO) links (or eSCO connections), other logical transport channel links, etc.

In some examples, the controller stack may implement link management protocol (LMP) functions, low energy link layer (LELL) functions, etc. The host stack may be generally implemented as part of an operating system, or as an installable package on top of an operating system. The host stack may be responsible for logical link control and adaptation protocol (L2CAP) functions, Bluetooth network encapsulation protocol (BNEP) functions, service discovery protocol (SDP) functions, etc. In some examples, the controller stack and the host stack may communicate via a host controller interface (HCI). In other cases, (e.g., for integrated devices such as Bluetooth headsets), the host stack and controller stack may be run on the same microprocessor to reduce mass production costs. For such host-less systems, the HCI may be optional, and may be implemented as an internal software interface.

A connection link 125 may be established between two Bluetooth-enabled devices (e.g., between a device 110 and a paired device 115) and may provide for communications or services (e.g., according to some Bluetooth profile). For example, a Bluetooth connection may be an eSCO connection for voice call (e.g., which may allow for retransmission), an ACL connection for music streaming (e.g., A2DP), etc. For example, eSCO packets may be transmitted in predetermined time slots (e.g., 6 Bluetooth slots each for eSCO). The regular interval between the eSCO packets may be specified when the Bluetooth link is established. The eSCO packets to/from a specific slave device (e.g., paired device 115) are acknowledged, and may be retransmitted if not acknowledged during a retransmission window. In addition, audio may be streamed between a device 110 and a paired device 115 using an ACL connection (A2DP profile). In some cases, the ACL connection may occupy 1, 3, or 5 Bluetooth slots for data or voice. Other Bluetooth profiles supported by Bluetooth-enabled devices may include Bluetooth Low Energy (BLE) (e.g., providing considerably reduced power consumption and cost while maintaining a similar communication range), human interface device profile (HID) (e.g., providing low latency links with low power requirements), etc.

A device may, in some examples, be capable of both Bluetooth and WLAN communications. For example, WLAN and Bluetooth components may be co-located within a device, such that the device may be capable of communicating according to both Bluetooth and WLAN communication protocols, as each technology may offer different benefits or may improve user experience in different conditions. In some examples, Bluetooth and WLAN communications may share a same medium, such as the same unlicensed frequency medium. In such examples, a device 110 may support WLAN communications via AP 105 (e.g., over communication links 120). The AP 105 and the associated devices 110 may represent a basic service set (BSS) or an extended service set (ESS). The various devices 110 in the network may be able to communicate with one another through the AP 105. In some cases the AP 105 may be associated with a coverage area, which may represent a basic service area (BSA).

Devices 110 and APs 105 may communicate according to the WLAN radio and baseband protocol for physical and MAC layers from IEEE 802.11 and versions including, but not limited to, 802.11b, 802.11g, 802.11a, 802.11n, 802.11ac, 802.11ad, 802.11ah, 802.11ax, etc. In other implementations, peer-to-peer connections or ad hoc networks may be implemented within system 100, and devices may communicate with each other via communication links 120 (e.g., Wi-Fi Direct connections, Wi-Fi Tunneled Direct Link Setup (TDLS) links, peer-to-peer communication links, other peer or group connections). AP 105 may be coupled to a network, such as the Internet, and may enable a device 110 to communicate via the network (or communicate with other devices 110 coupled to the AP 105). A device 110 may communicate with a network device bi-directionally. For example, in a WLAN, a device 110 may communicate with an associated AP 105 via downlink (e.g., the communication link from the AP 105 to the device 110) and uplink (e.g., the communication link from the device 110 to the AP 105).

In some examples, content, media, audio, etc. exchanged between a device 110 and a paired device 115 may originate from a WLAN. For example, in some examples, device 110 may receive audio from an AP 105 (e.g., via WLAN communications), and the device 110 may then relay or pass the audio to the paired device 115 (e.g., via Bluetooth communications). In some examples, certain types of Bluetooth communications (e.g., such as high quality or high definition (HD) Bluetooth) may require enhanced quality of service. For example, in some examples, delay-sensitive Bluetooth traffic may have higher priority than WLAN traffic.

Figure 2:
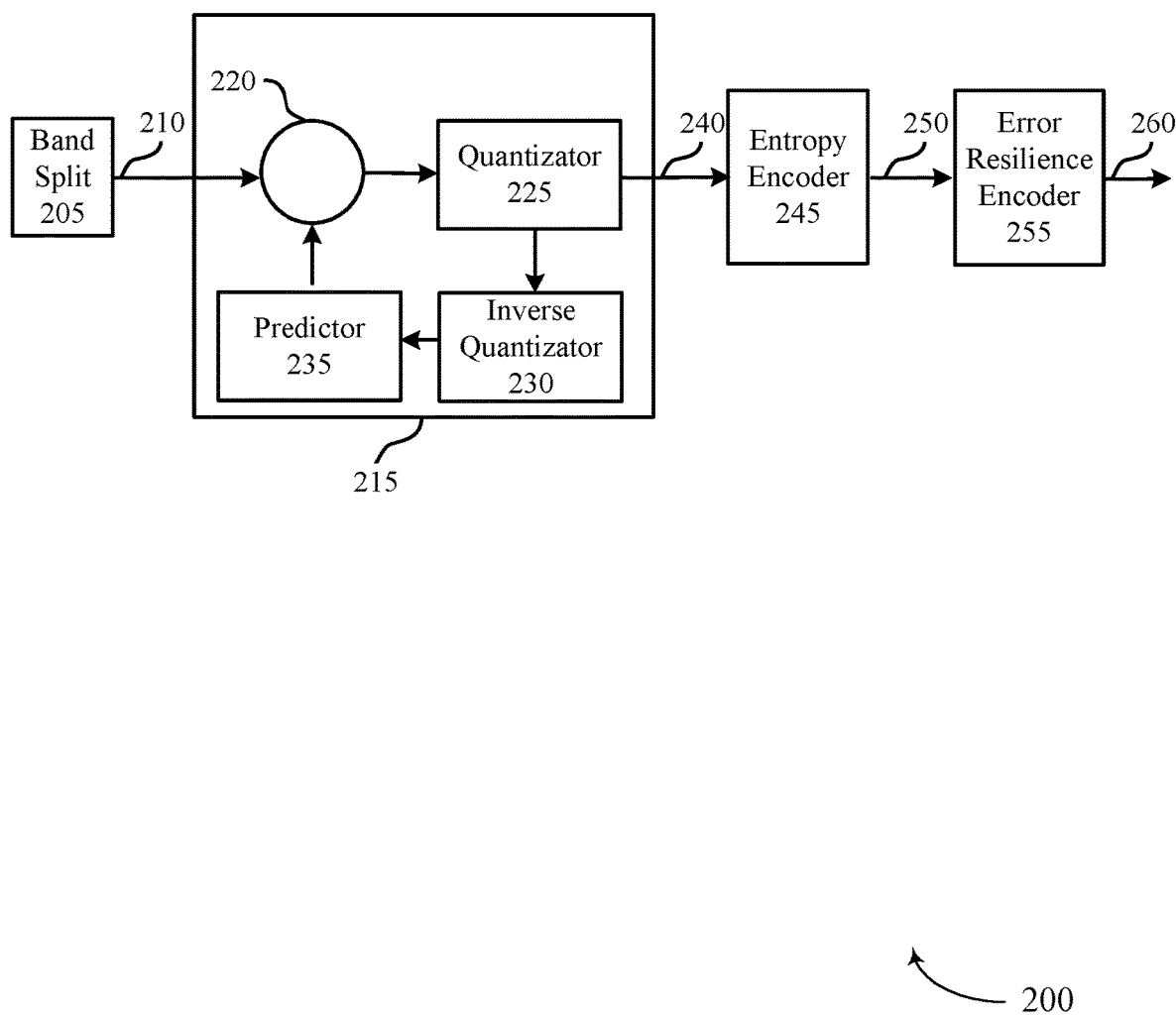
FIG. 2 illustrates an example of a signal encoder that supports quantization codeword selection for low cost parity checking in accordance with aspects of the present disclosure.

In some examples, a transmitting device (e.g., a source device such as a device 10-a) may encode a signal and may transmit one or more data packets (e.g., audio data packets) to a receiving device (e.g., a paired device 115, such as headphones, speakers, or the like). In some examples, another device may receive (e.g., and encode) the audio signal, and a source device 110-a may relay the encoded data packet to the device 115-a. The transmitting device may generate one or more entropy symbols, the length of which may change responsive to errors, may stack the entropy symbols into fixed intervals, and select a parity bit for each entropy symbol. The encoding device may divide entropy symbols that are longer than the fixed interval duration and stack the excess portions of the long entropy symbols with shorter entropy symbols in other intervals of the data packet. The encoding device may transmit the stacked data packet according to the stacking. The receiving device may receive the data packet, identify the locations of the entropy symbols and the selected parity bit, check the parity of each entropy symbol, identify error bits based on the locations of the entropy symbols within multiple fixed intervals, and may correct error bits based on the stacked intervals, the parity bit, and an error mask FIG. 2 illustrates an example of a signal encoder 200 that supports quantization codeword selection for low cost parity checking in accordance with aspects of the present disclosure. In some examples, the signal encoder 200 may implement aspects of a communication system as described with reference to FIG. 1. The signal encoder 200 may receive one or more signals (e.g., audio signals), may encode the signals into one or more data packets as described in greater detail with respect to FIGS. 3-5B, and may transmit the encoded data packets to a receiving device (e.g., a decoding device). The decoding device may receive the encoded data packets and identify errors, address the errors, and successfully decode the packet, based on the encoding and interval stacking described herein.

The signal encoder 200 may generate a compressed bit stream (e.g., by the bit allocation unit 215) for entropy encoding (e.g., by entropy encoder 245) and error resilience encoding (e.g., by error resilience encoder 255). The bit allocation unit 215 may map an input audio signal to one or more codewords 240 in a non-uniform table, which may reduce the total number of bits needed to encode the audio signal. The codewords 240 may approximate the input audio signal. The encoding process may generate an error. In some cases, the error can be used for low-cost parity procedures, as described in greater detail below.

The signal encoder 200 may perform a band split using band splitter 205. For instance, the signal encoder 200 may receive an audio signal. The signal encoder 200 may map the audio signal to available frequency spectrum, and may divide the spectrum into one or more non-uniform quantization bands 210. The band splitter 205 may represent a unit configured to separate the audio data (which may represent pulse coded modulation (PCM) audio data) into different quantization bands. The band splitter 205 may be an example of a quadrature mirror filterbank (QMF) or a conjugate mirror filter (CMF) which may also be referred to as power symmetric filters (PSF). The band splitter 205 may output the resulting quantization bands 210 to the bit allocation unit 215. The bit allocation unit 215 may include an error generation unit 220, a quantizator 225, an inverse quantizator 230, and a predictor 235. The bit allocation unit 215 may perform bit allocation resulting in a compressed bit stream for each quantization band 210.

The bit allocation unit 215 may analyze each of the quantization bands 210 to identify which of the quantization bands 210 include information salient in representing the sound field captured by the audio data, and may thereby allocate portions of the bit budget to one or more of the quantization bands 210. In some examples, the bit allocation unit 215 may determine a maximum peak to average power ratio (PAR) envelope for each of the quantization bands 210 and identify which of the quantization bands 210 should receive more bits than other quantization bands 210 (e.g., by performing differentiation and integration between the different quantization bands 210 to identify redundancies, etc.). The bit allocation unit 215 may, in some instances, identify a signal to noise ratio (SNR) for each of the quantization bands 210 (e.g., as an alternative to the maximum PAR envelope or in conjunction with the maximum PAR envelope). The bit allocation unit 215 may then perform compression on the allocated bits.

Figure 3:
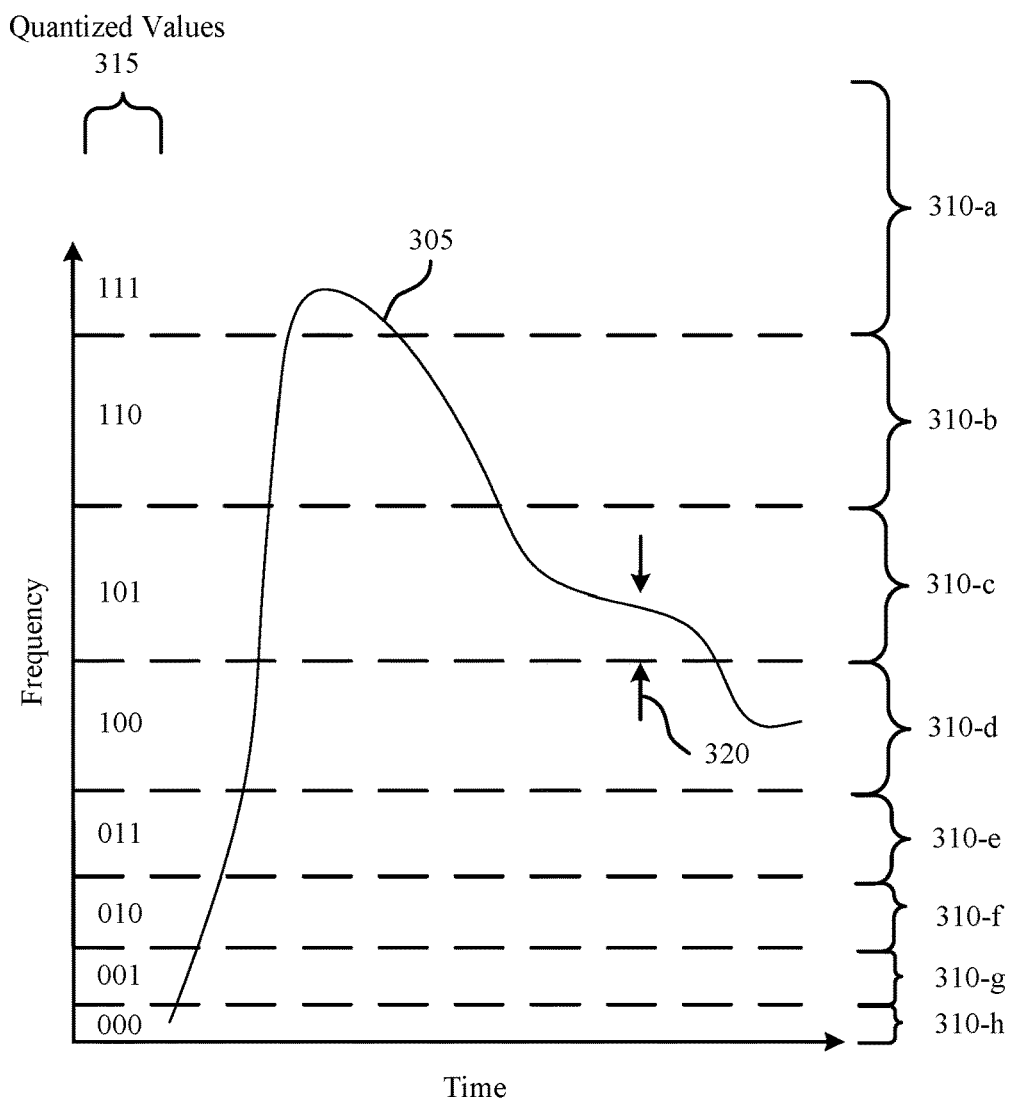
FIG. 3 illustrates an example of a bit selection scheme that supports quantization codeword selection for low cost parity checking in accordance with aspects of the present disclosure.

The error generation unit 220 may adjust one or more bits of one or more symbols by introducing a low cost error (e.g., including a low-cost bit allocation as described in greater detail with respect to FIG. 3). In some examples, the error generation unit may output an error (as a difference between a current block of a quantization bands 210, and a predicted quantization band 210 predicted from a previous block of a quantization bands 210). The previous block of the quantization band 210 may include a block that is temporally directly before the current block of the quantization bands 210. The error generation unit 220 may output the error to quantizator 225. In some examples, the error may be a low cost error identified by the error generation unit 220, such that an introduced error may have a decreased impact on signal quality. In some examples, the quantization bands 210 may initially bypass the error generation unit 220, until after one or more iterations of processing by the quantizator 225, the inverse quantizator 230, and the predictor 235.

The quantizator 225 may perform uniform or non-uniform quantization with respect to the error received from the error generation unit 2220. Uniform quantization may refer to quantization in which the quantization levels or intervals are uniform (or, in other words, the same). Non-uniform quantization may refer to quantization in which the quantization levels or intervals are not uniform. For example, the quantizator 225 may perform non-uniform quantization as the audio signal may generally not have a uniform distribution of samples especially in the presence of rapidly changing levels. The quantizator 225 may perform adaptive quantization (which is a form of lossy compression) based on a quantization step size, where such quantization is adaptive given that the quantization step size may change. The quantizator 225 may perform, based on the quantization step size, non-uniform quantization with respect to the error to obtain a quantized error. The quantizator 225 may output the quantized error to the inverse quantizator 230.

The inverse quantizator 230 may perform inverse quantization, based on the quantization step size, with respect to the quantized error output by the quantizator 225 to obtain a dequantized error. In this respect, the inverse quantizator 230 may operate reciprocally to the quantizator 225. The inverse quantizator 230 may output the dequantized error to the predictor 235.

The predictor 235 may predict, based on the dequantized error, a quantization band 210 to obtain a subsequent predicted quantization band 210 block. The predictor 235 may obtain the predicted quantization band 210 block by, for instance, adding dequantized error to a previously predicted quantization band block. The predictor 235 may output the predicted quantization band 210 block to the error generation unit 220 for introducing a new error for subsequent quantization bands 210 (e.g., for another portion of the audio input) or to adjust the previously set error for another iteration in the bit allocation unit 215, as described above.

The bit allocation unit 215 may output one or more compressed bitstreams allocated as codewords 240. The codewords 240 may represent compressed bit streams representative of salient aspects of the audio signal.

The entropy encoder 245 may receive the codewords 240. The entropy encoder may perform statistical lossless encoding (which may be referred to as "entropy encoding" or "entropy coding") with respect to the compressed bitstream to obtain one or more entropy symbols. An example of entropy coding may be Huffman coding, which may result in Huffman codewords or Huffman symbols (e.g., symbols 250). The entropy encoder 245 may output, based on the one or more codewords 240, one or more symbols 250. While entropy encoding may provide additional compression, such entropy encoding may sacrifice error resiliency. That is, prefix-code entropy encoding, like Huffman coding, may be intolerant of bit errors as a single error (e.g., flipping a bit from a zero to a one or a one to a zero) which may invalidate the prefix property of prefix-code entropy encoding in which each codeword is restricted from being a prefix of any other codeword, thereby preventing correct parsing of the errored codeword 240, and symbol 250.

In some examples, entropy encoder 245 may encode the codewords using, for example, Huffman coding. Huffman coding may produce a random pattern of bits for symbols 250. The grouping of states in Huffman coding may be carried out with the lowest probability of states first, followed by increasing probability of states. In some examples, the entropy encoder 245 may change the order of the branches of a Huffman tree such that errors in encoding or decoding result in a change in the length of a symbol 250. In such cases, entropy encoder 245 may order the branches of a Huffman tree such that the length of a symbol 250 is indicated by a symbol read. That is, the decoding of each subsequent branch of a symbol 250 by a decoding device may result in increased or updated information regarding the duration of the symbol 250. Thus, the decoding of an error bit in a symbol 250 will result in a change in the symbol duration. For instance, if a first 4 bit where 0xF, then a symbol may be between 7 bits and 15 bits. If another bit is read by a decoding device, and the bit is a 0 (e.g., indicating a 0x1E), then the decoding device may determine that the symbol 250 is 7 bits long. As a decoding device reads more bits, more clarity is given on the length of the symbol 250.

Figure 4:
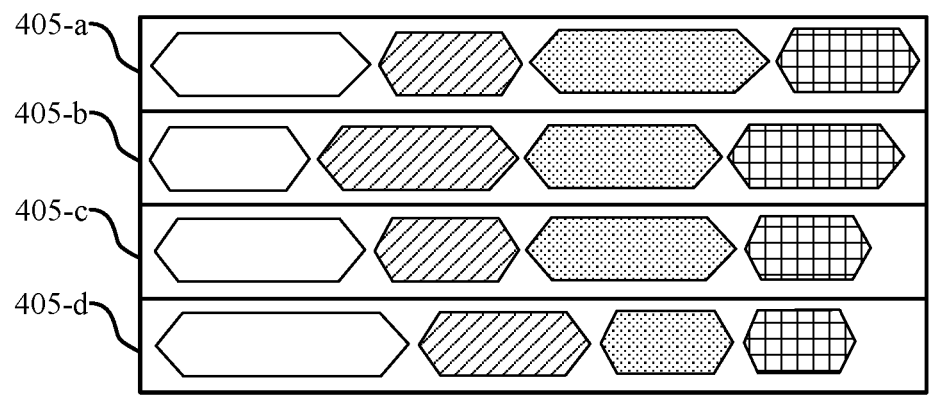
FIG. 4 illustrates an example of an interval packing scheme that supports quantization codeword selection for low cost parity checking in accordance with aspects of the present disclosure.
Figure 4:
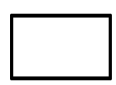
Figure 4:
Figure 4:
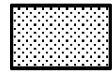
Figure 4:
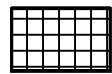
Figure 5A:
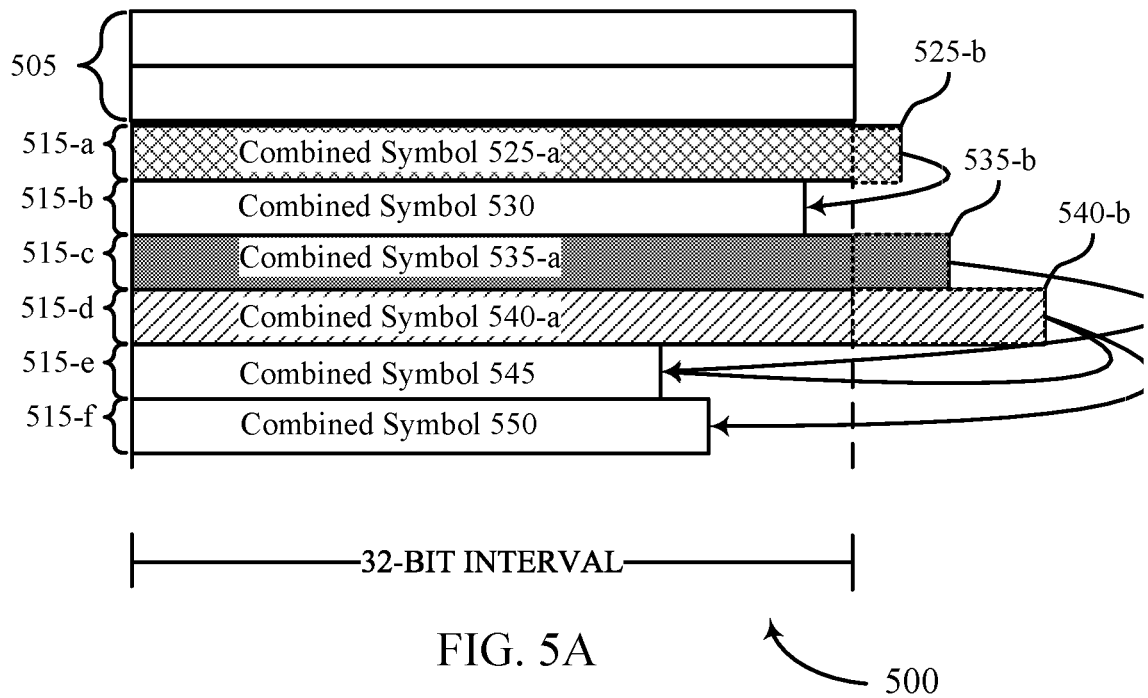
FIG. 5A illustrates an example of a data packet that supports quantization codeword selection for low cost parity checking in accordance with aspects of the present disclosure.
Figure 5B:
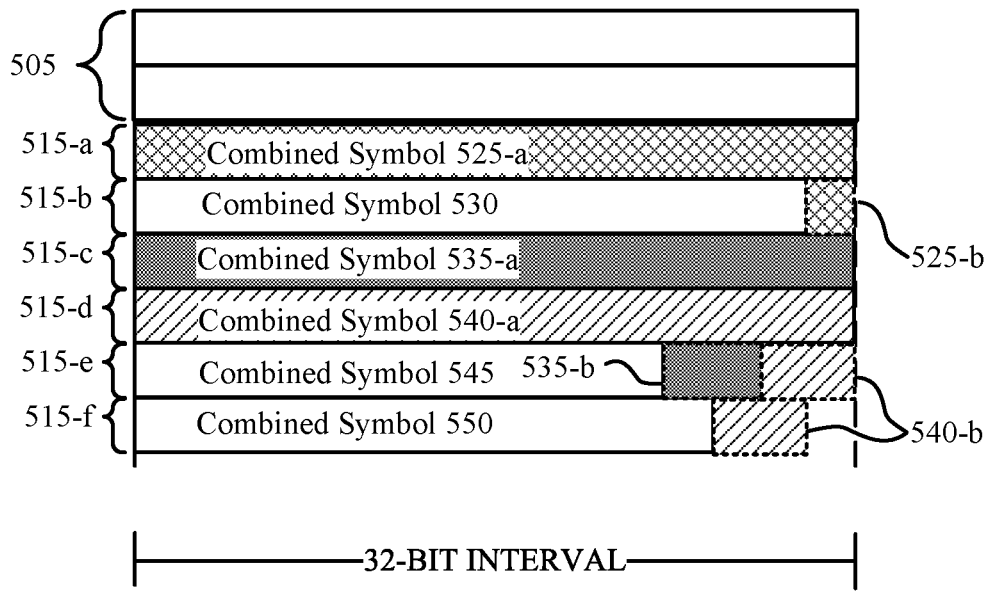
FIG. 5B illustrates an example of a data packet that supports quantization codeword selection for low cost parity checking in accordance with aspects of the present disclosure.

To reduce the impact of the sacrificed resiliency, the error resilience encoder 255 may specify (or, in other words, "pack" or "stack") the irregular symbols into regular symbols 260, as described in greater detail with respect to FIGS. 4, 5A, and 5B. The intervals may be regular in the sense that each interval is of a uniform (or, in other words, same) bit length (e.g., 32 bits). Additionally, the error resilience encoder 255 may provide error resiliency via various error resiliency schemes, such as parity bit schemes. In some cases, the error resilience encoder 255 may designate or identify or add a low-cost parity bit to each combined symbol (e.g., including a concatenation of entropy symbols corresponding to each quantization band 210) of a packed interval, such that when entropy encoded symbols are received with one or more error bits (e.g., due to encoding errors, decoding errors, interference, or the like), the decoding device may identify a change in the duration of one or more affected symbols across one or more intervals, resulting in parity of at least one affected symbol reflecting the errors. By identifying an error that affects multiple symbols 260 across multiple interval based on the entropy encoder 245 and the error resilience encoder 255, a decoding device may identify error bits, and apply an error mask to correct the error bits. Thus, packing intervals 260 with entropy encoded symbols that change length based on errors, and the error resilience (including stacking symbols across multiple intervals) may provide for the identification of error bits and correction of error bits. This may result in an increased likelihood of successful decoding of audio signals, lower cost at the encoding and decoding devices, and improved user experience.

FIG. 3 illustrates an example of a bit selection scheme 300 that supports quantization codeword selection for low cost parity checking in accordance with aspects of the present disclosure. In some examples, the bit selection scheme 300 may implement techniques described with reference to FIGS. 1 and 2, using devices, encoders, units, and the like, as described with reference to FIGS. 1 and 2.

In some examples, as described with reference to FIG. 2, an encoding device may divide (e.g., via a band splitter) available frequency spectrum corresponding to an audio signal 305 into one or more quantization bands 310. The quantization bands 310 may not be uniform. In such cases, an encoder of an encoding device may map the audio signal 305 to the quantization bands 310. Portions of the audio signal 305 may thus correspond to quantized values 315 (e.g., sets of bits) representing salient portions of the audio signal 305. Together, the quantized values 315 may be codewords that reduce the total number of bits used to encode the audio signal 305. The codewords may include a string of quantized values 315 for each quantization band 310, which may approximate the audio signal 305. In some examples, quantized values 315 may be 3 bits long, as illustrated with respect to FIG. 3, or more than 3 bits, or less than 3 bits (not shown). In some examples, the number of bits per quantized value 315 may not be the same for all quantization bands 310. For instance, an encoding device (e.g., a quantizator of a bit allocation unit) may allocate a higher number of bits for quantized values 315 of quantization bands 310 that are more sensitive to the human ear than quantization bands 310 which the human ear is relatively insensitive.

In some examples, a concatenated set of codewords or symbols may be adjusted (e.g., by error resilience encoding) to introduce a low-cost error to the encoded bit stream. That is, because the quantization bands 310 are non-uniform, different bits of the quantized values 315 may be less significant (e.g., may have a lower cost associated with a bit-flip) than other bits. Such bits may be utilized to introduce parity into a codeword or encoded symbol.

For example, each quantized value 315 may undergo a quantization process. The encoding device (e.g., including a predictor) may generate a prediction error value during quantization of a prediction error value. In some examples, a quantizer of an encoding device may select from a plurality of quantization bands 310, where each quantization band may cover a respective range of values that the prediction error value could take and may be represented by a respective quantized value 315. In some examples, each quantization band 310 may be arranged (e.g., by a band splitter) such that a least significant bit (e.g., a final bit of a quantized value 315, or another designated bit of each quantized value 315 associated with a respective quantization band 310) may be the inverse of the least significant bit of the quantized value 315 associated with the quantization band 310 immediately above the quantization band 310 and immediately below the quantization band 310. For instance, an audio signal 305 (e.g., a continuous waveform) may be quantized using eight quantization bands 310 (e.g., quantization bands 310-a, 310-b, 310-c, 310-d, 310-e, 310-f, 310-g, and 310-h). The quantized value 315 corresponding to the quantization band 310-a (e.g., three bits: 110) may have least significant bit that is the last bit of the quantized value 315 (e.g., 0). The quantization band 310-a, which is immediately above the quantization band 310-b, may correspond to a quantized value 315 of 111, having a least significant bit of 1. Similarly, the quantization band 310-c, which is immediately below the quantization band 310-b, may correspond to a quantized value 315 of 101, having a least significant bit of 1. Thus, the least significant bit of the quantization band above and below quantization band 310-b is the inverse of the least significant bit of quantization band 310-b.

In some examples, the encoding device may determine that, based on the fact that the least significant bit of a quantized value 315 is the inverse of the least respective bit of alternative quantized values (e.g., for the quantization band 310 above and below the quantized value 315), a cost of using alternative quantized values 315 (e.g., flipping the least significant bit of the quantized value 315 or using the bit for another purpose). This cost may be calculated for each quantization band 310. The encoding device may determine a quantization band on which repurposing the least significant bit of the quantized value 315 will have a decreased (e.g., least cost as calculated for each quantization band 310) impact on the quality of the encoded audio signal 305. The encoding device may introduce a low-cost error (e.g., error 320) for the determined quantized value, by repurposing the least significant bit of the quantized value 315 in quantization band 310-c, and designating the repurposed bit as a parity bit. Thus, parity can be introduced to generated codewords or symbols without adding a high-cost set of one or multiple parity bits to a data packet or symbol of a data packet.

In some examples, a parity bit may be added, instead of repurposed. In some examples, the encoding device may designate one parity bit per codeword for the set of codewords, one parity bit symbol or parity bit interval for all parity bits of a data packet, one parity bit for each concatenated symbol including a portion of a symbol from each quantization band 310, or the like.

In some examples, a parity bit may be used, by a decoding device, to determine that an error in encoding or decoding has occurred (e.g., to determine that there is an error bit in a data packet). For instance, the parity bit may indicate an even or odd number of is or Os in a bitstream. If the parity bit and the even or odd number of is or Os do not match, then a decoding device may determine that an error has occurred, and may apply an error mask to identify the error bit, and correct the error. If such an error occurs at a decoding device without correction, then errors may propagate throughout a data packet, resulting in failed decoding. However, by identifying and correcting the error bit, encoding may continue successfully. In some examples, two error bits (e.g., or any even number of error bits) may occur within a data packet. In such examples, a parity check using a parity bit may not successfully identify that errors have occurred in encoding or decoding. In such cases, decoding errors may propagate, resulting in failed decoding.

One costly method of addressing such deficiencies in parity checking may include adding a large number of parity bits for more discrete parity checking. However, adding parity bits is associated with a higher cost to encoding and decoding devices. Instead, as described herein, low-cost parity bits may be designated in a data packet, and symbols may be entropy encoded to change in length when decoded improperly. These changes to symbol length based on error may cause the propagation of errors across intervals, which may allow for cross-interval error checking (e.g., even in the case of an even number of error bits) using the low-cost parity bits, as described in greater detail with reference to FIGS. 4, 5A, and 5B.

FIG. 4 illustrates an example of an interval packing scheme 400 that supports quantization codeword selection for low cost parity checking in accordance with aspects of the present disclosure. In some examples, interval packing scheme 400 may implement aspects of the bit selection scheme 300 and the signal encoder 200.

In some examples, as described above with respect to FIG. 2, an encoding device may generate (e.g., using a bit allocation unit) one or more codewords. The codewords may be generated to closely match quantization values of a quantization table, to decrease error. The operation may be performed for a number of quantization bands 410 (e.g., four quantization bands 410). The encoding device may perform entropy encoding, as described in greater detail with reference to FIG. 5, to generate one or more symbols.

In some examples, the encoding device may (e.g., using error resilience encoding) concatenate aspects of one or more symbols into various fixed intervals 405. Each interval 405 may have a duration of a fixed number of bits (e.g., 32 bits). in some examples, the encoding device may concatenate at least one entropy symbol (e.g., an entropy encoded codeword) from each quantization band 410 into each interval 405. For instance, the encoding device may combine an entropy symbol from quantization band 410-a, an entropy symbol from quantization band 410-b, an entropy symbol from quantization band 410-c, and an entropy symbol from quantization band 410-d. The combined entropy symbols may be referred to as a combined symbol, a symbol, or an entropy symbol. That is, each combined symbol may refer to a combination of entropy symbols corresponding to different quantization bands 410. The encoding device may pack a first combination symbol, including the concatonation of entropy symbols from each quantiozation band 410, into a first interval 405-a, a second combined symbol into interval 405-b, a third combined symbol into interval 405-c, and a fourth combined symbol into interval 405-d.

In some examples, the encoding device may determine a parity bit for each interval 405. In some examples, the encoding device may select a least significant bit of a quantization value for a particular quantization band, and may designate that bit as the parity bit. A single parity bit for each interval 405 may be sufficient to control the parity of a combined symbol. In such cases, a least significant bit, having a low cost, may be selected within a single quantization band 410, and that least significant bit may be used to control the parity of a combined symbol including entropy symbols from all quantization bands 410). Thus, if a parity bit is to be changed, then designating a least significant bit as the parity bit may be likely to result in a small (e.g., unnoticed by a user) impact on the audio quality of the encoded audio signal.

In some examples, the combination of a combined symbol including multiple concatenated entropy symbols that change length due to errors and the low-cost parity bit may result in a resilient data packet that can be used to cross check parity across intervals 405 to identify and address errors, as described in greater detail with respect to FIG. 5.

FIG. 5A illustrates an example of a data packet 500 that supports quantization codeword selection for low cost parity checking in accordance with aspects of the present disclosure. In some examples, data packet 500 may implement aspects of signal encoder 200, bit selection scheme 300, and interval packing scheme 400.

In some examples, an encoding device may generate a data packet 500 for transmission to a decoding device. The data packet 500 may include a header 505, one or more intervals 515, a primary silo, and a secondary silo.

The header 505 may include a number of bytes (e.g., 18 bytes). The header may include a synchronization header, as well as a bit allocation. The bit allocation may include a number of bits (e.g., 84 bits), and may include a bit allocation for all quantization bands. For instance, the encoding device may select and designate (or add) a parity bit (e.g., a low-cost parity bit as described with reference to FIG. 3). The encoding device may indicate, in the bit allocation portion of the header 505, which bit for each interval 515 is the parity bit. Additionally, the bit allocation portion of header 505 may indicate which combined symbols have been stacked (e.g., placed) in which intervals 515, as described herein. Thus, when a decoding device receives the data packet 500, it may determine, based on the bit allocation information, where the parity bit is located, where various combination symbols are located, and may begin to decode the data packet.

The packet may also include primary and secondary silos. The primary silo may include at least the first portion of each interval 515. At least the first portion of each combined symbol (e.g., combined symbols 525, 530, 535, 540, 545, and 550) may be located within the primary silo.

In some examples, one or more combined symbols may not take up the entirety of an interval 515. For example, combined symbol 530 may not fill the entire 32 bits of interval 515-b. Similarly, combined symbol 545 and combined symbol 550 may not fill interval 515-e and interval 515-f, respectively. The remaining portions of intervals 515 left empty by shorter combined symbols may be referred to as a secondary silo. An encoding device may allocate bits from a combined symbol that do not fit within the primary silo. Unused portions of intervals (e.g., at the end of an interval) may include secondary data. Thus, the extra, unfilled portions of interval 515-b, 515-e, and 515-f may be referred to as secondary silos.

In some examples, the encoding device may take excess portions of combined symbols that do not fit within an interval 515, and may fill the secondary silo with the excess bits of the excess portions. For instance, combined symbol 525 may include a first portion 525-a that fits within interval 515-a, and an excess portion 525-b that does not fit within interval 515-a. Excess portion 525-b may include one or more excess bits. The encoding device (e.g., using an error resilience encoder) may remove excess portion 525-b of combined symbol 525, from interval 515-a (where it does not fit) and may move it down (e.g., forward filling) the packet into the secondary silo (e.g., into a subsequent interval 515, such as interval 515-b). Similarly, the encoding device may remove the excess portion 535-b of combined symbol 535, and may stack excess portion 535-b of combined symbol 535 into the secondary silo (e.g., the next available interval 515, which may be interval 515-e). Similarly, the encoding device may remove the excess portion 540-b of combined symbol 540, and may place the excess portion 540-b into the secondary silo (e.g., the next available interval 515, which may be interval 515-e). In some examples, excess portion 540-b of combined symbol 540 may not fit in a single interval 515 of the secondary silo. For instance, the encoding device may stack a part of excess portion 540-b in interval 515-e, and another part of excess portion 540-b in interval 515-f. Upon performing such interval stacking, the data packet 500 may be ready for transmission to a decoding device, which may perform decoding of the data packet 500.

In some examples, decoding data packets may include performing decoding (e.g., Huffman decoding), and the length of each combined symbol of data packet 500 may change responsive to encoding or decoding errors (e.g., error bits). In some examples, the change in duration may be based solely on the decoding, as described in greater detail with respect to FIG. 5B. In some examples, the change in duration may be based solely on the encoding. That is, the encoding device may order the branches of a Huffman tree during the encoding process to ensure that more information regarding the bitstream is determined as each branch of the tree is decoded. In other examples, the change in duration may be based on both the encoding (e.g., reordering of branches during encoding by the encoding device) and the decoding (e.g., reordering of branches during decoding by the decoding device).

The encoding device may generate an error mask corresponding to the encoded data packet. In some examples, the encoding device may transmit, to a decoding device, the error mask and the data packet 500 together, in a single transmission. For instance, the error mask may be included in the header 505, a final portion of the data packet 500 (not shown), or in a separate portion of a data transmission. In some examples, the encoding device may transmit the error mask in a separate transmission from the data packet 500.

FIG. 5B illustrates an example of a data packet 501 that supports quantization codeword selection for low cost parity checking in accordance with aspects of the present disclosure. In some examples, data packet 501 may implement aspects of signal encoder 200, bit selection scheme 300, and interval packing scheme 400. In some examples, the data packet 501 may be an example of data packet 500, as received by a decoding device.

Data packet 501 may include a header 505, and one or more combined symbols located in multiple fixed intervals (e.g., 32 bit intervals 515). The combined symbols may be located in a primary silo, and a secondary silo.

A decoding device may receive the data packet 501 from an encoding device, and may begin to decode the data packet 501, starting at the top and working down. Upon decoding the header 505, the decoding device may determine the location of a parity bit for each combined symbol, and may determine the location of each combined symbol within the data packet 501. For instance, the encoding device may determine the location of a low-cost parity bit in each interval 515, and may determine that combined symbol 525 is located both in interval 515-a and interval 515-b, that combined symbol 535 is located both in interval 515-c and interval 515-e, and that combined symbol 540 is located in interval 515-d, 515-e, and 515-f.

The decoding device may decode the intervals 515 such that error bits in each combined symbol change the length of the combined symbol. For example, the decoding device may use Huffman decoding. Huffman decoding may include decoding each combined symbol (including the concatenated entropy symbols of each combined symbol, as described in greater detail with respect to FIG. 4) according to an adjusted Huffman tree structure. For instance, as described herein, a decoding device (or an encoding device, or both), may order the branches of a Huffman tree such that decoding each branch of a Huffman tree provides additional information regarding the duration of the combined symbol. In such examples, if an error in decoding or encoding has occurred (e.g., an error bit is included in the combined symbol), then the duration of the combined symbol may change (e.g., get longer). In such examples, an error bit in one combined symbol may affect the number of bits, and thus the parity, of one or more combined symbols located in a different interval 515.

For example, the decoding device may decode combined symbol 525. The encoding device may determine that combined symbol 525-a is located in interval 515-a, and the excess portion 525-b of combined symbol 525 is located in interval 515-b. If there are no error bits in combined symbol 525, then the decoding device may successfully decode the combined symbol 525. The encoding device may check the parity of combined symbol 525 using the parity bit.

The decoding device may decode the combined symbol 530. The decoding device may check the parity of the combined symbol 530, and determine that no errors have occurred. In some examples, combined symbol 530 may have a single error bit. The encoding device may perform a parity check, and may determine that the parity of the combined symbol 530 is wrong. In such examples, the decoding device may identify the error bit using the error mask, and may correct the error bit, resulting in correct decoding of combined symbol 530. The decoding device may similarly decode additional combined symbols. However, multiple error bits (e.g., an even number of error bits) may not be caught by a simple parity check on a single interval 515. Instead, a change in duration of a symbol may be detected, which may change the parity in one or more intervals.

In some examples, a combined symbol may include multiple error bits (e.g., as a result of an encoding error, poor transmission or reception quality, or a decoding error). For example, combined symbol 540 may include two error bits. Because two error bits could result in maintained parity, a parity check alone may not be sufficient to identify the error bits. The decoding device may begin decoding the first portion 540-a of combined symbol 540. Upon finding one or more of the error bits, the length of combined symbol 540 may change. Because combined symbol 540 is located in interval 515-d, interval 515-e, and interval 515-f, a change in the duration of combined symbol 540 may affect the combined symbols located in interval 515-e and interval 515-f (e.g., combined symbol 545 and combined symbol 550, respectively). For example, as the duration of combined symbol 540 changes, then the excess portions 540-b may also change, resulting in a different number of even bits, odd bits, or both, in intervals 515-e and 515-f. This change in bits may change the parity of combined symbol 540, combined symbol 545, combined symbol 550, or any combination thereof. A parity check in each interval 515 may thus identify the location of the error bits (e.g., in the first portion 540-a of combined symbol 540, and the excess portion 540-b of combined symbol 540 located in interval 515-e. Having determined existence and general location of the two error bits, based on the changed parity in one or more of combined symbol 540, combined symbol 545, and combined symbol 550, the decoding device may apply an error mask to one or more of combined symbol 540, combined symbol 545, and combined symbol 550 to identify the specific location of the two error bits, and may correct the error bits, resulting in a successful decoding of combined symbol 540. The decoding device may similarly decode combined symbol 545 and combined symbol 550, using combined symbol 540 as a cross check to ensure successful parity checks and decodes for combined symbol 545 and combined symbol 550.

Figure 6:
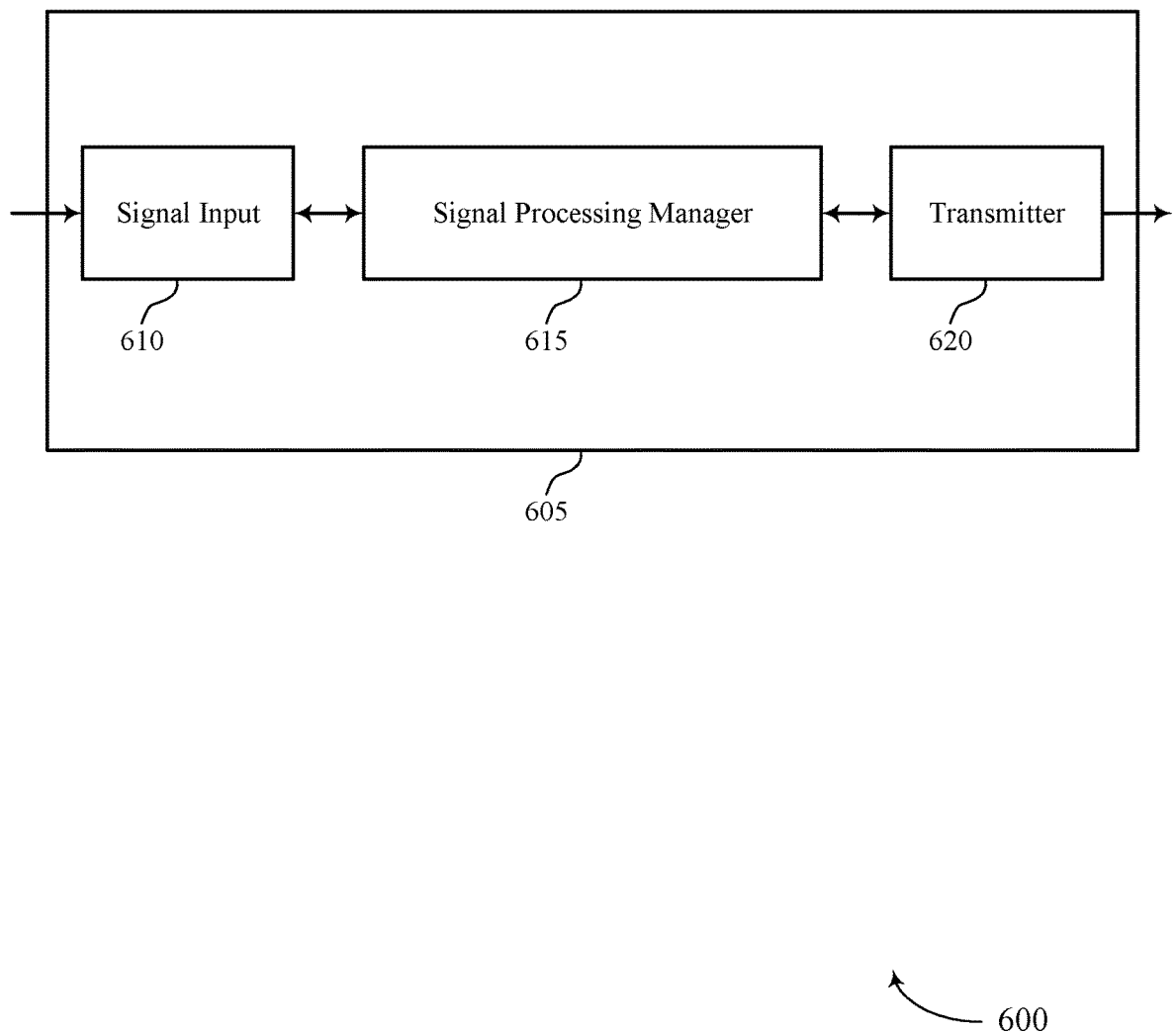
FIGS. 6 and 7 show block diagrams of devices that support quantization codeword selection for low cost parity checking in accordance with aspects of the present disclosure.

FIG. 6 shows a block diagram 600 of a device 605 that supports quantization codeword selection for low cost parity checking in accordance with aspects of the present disclosure. The device 605 may be an example of aspects of a device as described herein. The device 605 may include a signal input 610, a signal processing manager 615, and a transmitter 620. The device 605 may also include a processor. Each of these components may be in communication with one another (e.g., via one or more buses).

The signal input 610 may receive information such as packets, user data, or control information associated with various information channels (e.g., control channels, data channels, and information related to quantization codeword selection for low cost parity checking, etc.). Information may be passed on to other components of the device 605. The signal input 610 may be an example of aspects of the transceiver 920 described with reference to FIG. 9. The signal input 610 may utilize a single antenna or a set of antennas.

The signal processing manager 615 may receive a data packet including a set of intervals each having the same bit length and including one or more entropy symbols corresponding to one or more quantization bands, identify a first portion and a second portion of a first entropy symbol of the one or more entropy symbols, the first portion of the first entropy symbol in a first interval of the set of intervals and the second portion of the first entropy symbol in a second interval of the set of intervals, identify one bit for each interval of the data packet as a parity bit based on an indication of the identified parity bit included in the data packet, initiate a decoding procedure for the packet, where the length of each entropy symbol changes responsive to one or more encoding or decoding errors, successfully complete the decoding procedure for the data packet based on applying the error mask, determine, based on identifying the parity bit and identifying the first portion and the second portion of the first entropy symbol, that an error has occurred in encoding or decoding in the first interval and the second interval, and apply an error mask to the first interval, the second interval, or both. The signal processing manager 615 may be an example of aspects of the signal processing manager 910 described herein.

The signal processing manager 615, or its sub-components, may be implemented in hardware, code (e.g., software or firmware) executed by a processor, or any combination thereof. If implemented in code executed by a processor, the functions of the signal processing manager 615, or its sub-components may be executed by a general-purpose processor, a DSP, an application-specific integrated circuit (ASIC), a FPGA or other programmable logic device, discrete gate or transistor logic, discrete hardware components, or any combination thereof designed to perform the functions described in the present disclosure.

The signal processing manager 615, or its sub-components, may be physically located at various positions, including being distributed such that portions of functions are implemented at different physical locations by one or more physical components. In some examples, the signal processing manager 615, or its sub-components, may be a separate and distinct component in accordance with various aspects of the present disclosure. In some examples, the signal processing manager 615, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

The transmitter 620 may transmit signals generated by other components of the device 605. In some examples, the transmitter 620 may be collocated with a signal input 610 in a transceiver module. For example, the transmitter 620 may be an example of aspects of the transceiver 920 described with reference to FIG. 9. The transmitter 620 may utilize a single antenna or a set of antennas.

Figure 7:
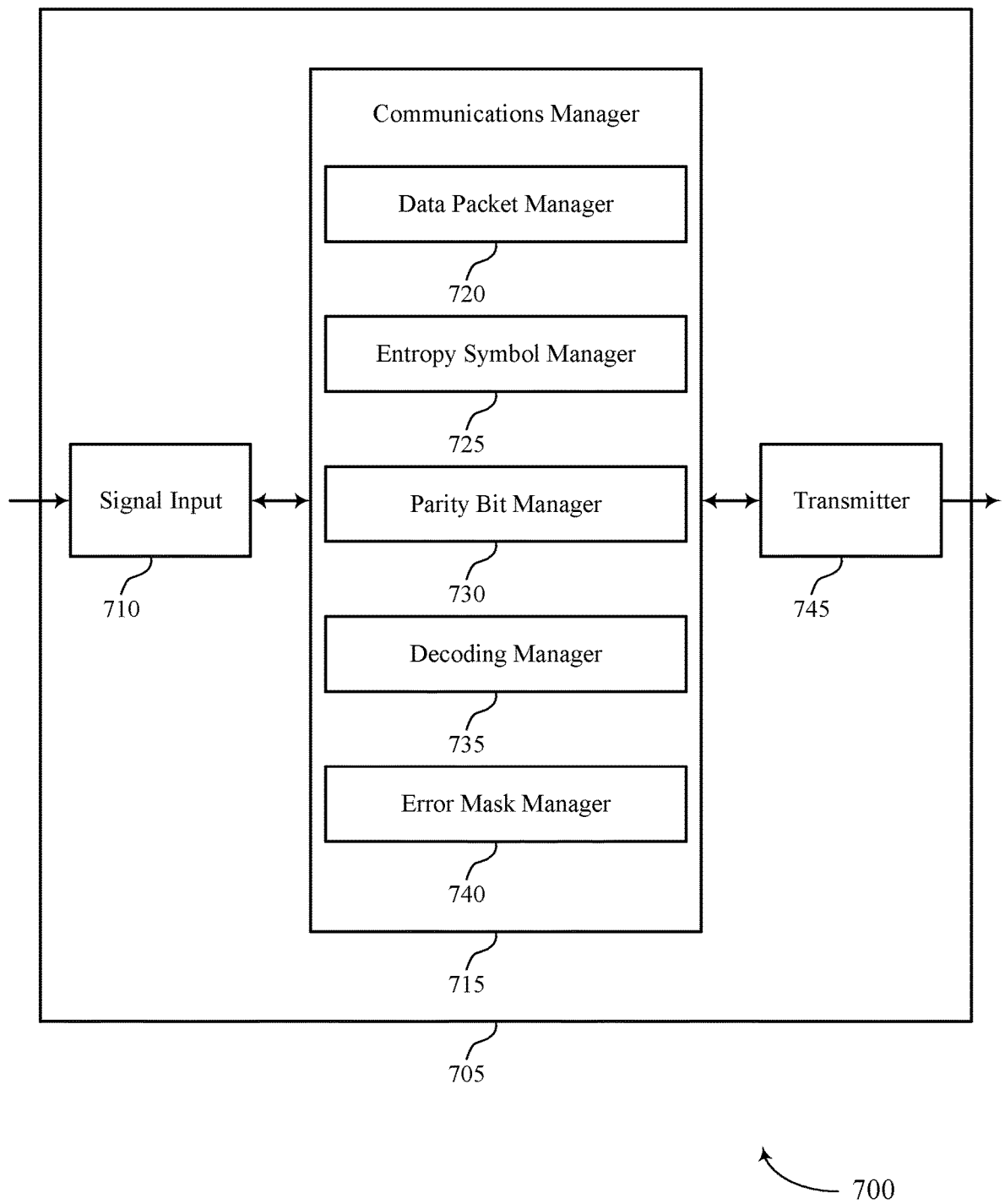

FIG. 7 shows a block diagram 700 of a device 705 that supports quantization codeword selection for low cost parity checking in accordance with aspects of the present disclosure. The device 705 may be an example of aspects of a device 605, or a UE 115 as described herein. The device 705 may include a signal input 710, a signal processing manager 715, and a transmitter 745. The device 705 may also include a processor. Each of these components may be in communication with one another (e.g., via one or more buses).

The signal input 710 may receive information such as packets, user data, or control information associated with various information channels (e.g., control channels, data channels, and information related to quantization codeword selection for low cost parity checking, etc.). Information may be passed on to other components of the device 705. The signal input 710 may be an example of aspects of the transceiver 920 described with reference to FIG. 9. The signal input 710 may utilize a single antenna or a set of antennas.

The signal processing manager 715 may be an example of aspects of the signal processing manager 615 as described herein. The signal processing manager 715 may include a data packet manager 720, an entropy symbol manager 725, a parity bit manager 730, a decoding manager 735, and an error mask manager 740. The signal processing manager 715 may be an example of aspects of the signal processing manager 910 described herein.

The data packet manager 720 may receive a data packet including a set of intervals each having the same bit length and including one or more entropy symbols corresponding to one or more quantization bands.

The entropy symbol manager 725 may identify a first portion and a second portion of a first entropy symbol of the one or more entropy symbols, the first portion of the first entropy symbol in a first interval of the set of intervals and the second portion of the first entropy symbol in a second interval of the set of intervals.

The parity bit manager 730 may identify one bit for each interval of the data packet as a parity bit based on an indication of the identified parity bit included in the data packet.

The decoding manager 735 may initiate a decoding procedure for the packet, where the length of each entropy symbol changes responsive to one or more encoding or decoding errors and successfully complete the decoding procedure for the data packet based on applying the error mask.

The error mask manager 740 may determine, based on identifying the parity bit and identifying the first portion and the second portion of the first entropy symbol, that an error has occurred in encoding or decoding in the first interval and the second interval and apply an error mask to the first interval, the second interval, or both.

The transmitter 745 may transmit signals generated by other components of the device 705. In some examples, the transmitter 745 may be collocated with a signal input 710 in a transceiver module. For example, the transmitter 745 may be an example of aspects of the transceiver 920 described with reference to FIG. 9. The transmitter 745 may utilize a single antenna or a set of antennas.

Figure 8:
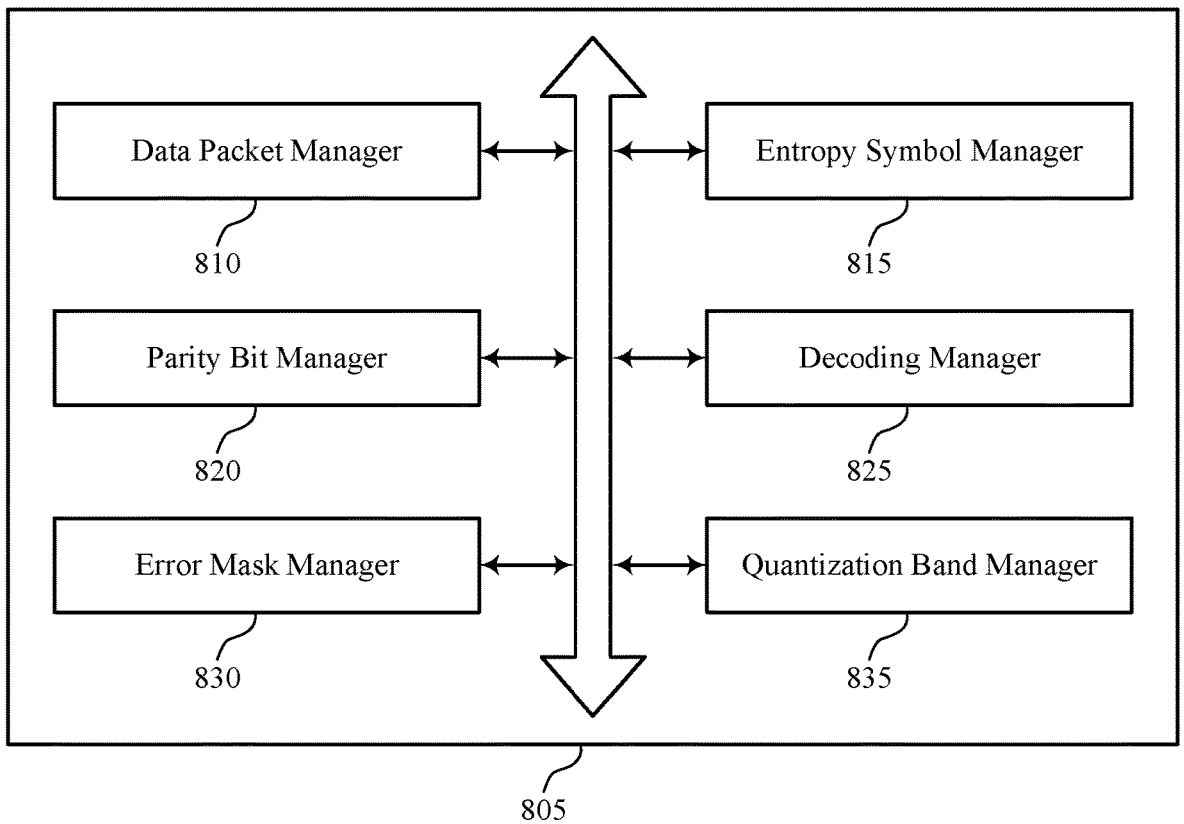
FIG. 8 shows a block diagram of a signal processing manager that supports quantization codeword selection for low cost parity checking in accordance with aspects of the present disclosure.

FIG. 8 shows a block diagram 800 of a signal processing manager 805 that supports quantization codeword selection for low cost parity checking in accordance with aspects of the present disclosure. The signal processing manager 805 may be an example of aspects of a signal processing manager 615, a signal processing manager 715, or a signal processing manager 910 described herein. The signal processing manager 805 may include a data packet manager 810, an entropy symbol manager 815, a parity bit manager 820, a decoding manager 825, an error mask manager 830, and a quantization band manager 835. Each of these modules may communicate, directly or indirectly, with one another (e.g., via one or more buses).

The data packet manager 810 may receive a data packet including a set of intervals each having the same bit length and including one or more entropy symbols corresponding to one or more quantization bands.

The entropy symbol manager 815 may identify a first portion and a second portion of a first entropy symbol of the one or more entropy symbols, the first portion of the first entropy symbol in a first interval of the set of intervals and the second portion of the first entropy symbol in a second interval of the set of intervals. In some examples, the entropy symbol manager 815 may determine, based on determining that the length of the first portion of the first entropy symbol has changed, that the length of the second portion of the first entropy symbol has changed. In some cases, each interval of the set of intervals includes at least one entropy symbol from each quantization band of the set of quantization bands.

The parity bit manager 820 may identify one bit for each interval of the data packet as a parity bit based on an indication of the identified parity bit included in the data packet. In some examples, the parity bit manager 820 may determine, based on checking the parity of each interval, that the length of the first portion of the first entropy symbol has changed, based on two or more error bits located in the first entropy symbol. In some examples, the parity bit manager 820 may identify a least significant bit of the entropy symbol corresponding to the first quantization band. In some examples, the parity bit manager 820 may select the least significant bit of the entropy symbol corresponding to the first quantization band as the parity bit for all entropy symbols stacked in the same interval as the entropy symbol corresponding to the first quantization band, where identifying the one bit for each interval of the data packet as the parity bit is based on the selecting. In some examples, the parity bit manager 820 may check each interval for parity based on the identified parity bit and the decoding, where determining that an error has occurred in encoding or decoding in the first interval and the second interval is based on the checking.

The decoding manager 825 may initiate a decoding procedure for the packet, where the length of each entropy symbol changes responsive to one or more encoding or decoding errors. In some examples, the decoding manager 825 may successfully complete the decoding procedure for the data packet based on applying the error mask. In some examples, the decoding manager 825 may determine that the length of the first portion of the first entropy symbol has changed, determining that the length of the second portion of the first entropy symbol has changed, or both, are based on a decoding a Huffman tree. In some cases, the Huffman tree includes a set of ordered branches, each ordered branch of the Huffman tree providing to the receiving device additional information regarding the length of an entropy symbol.

The error mask manager 830 may determine, based on identifying the parity bit and identifying the first portion and the second portion of the first entropy symbol, that an error has occurred in encoding or decoding in the first interval and the second interval. In some examples, the error mask manager 830 may apply an error mask to the first interval, the second interval, or both. In some examples, the error mask manager 830 may determine, based on the determined change in the length of the first portion of the first entropy symbol, the second portion of the first entropy symbol, or both, that the two or more error bits are located in the first interval, the second interval, or both, where applying the error mask is based on determining that the two or more error bits are located in the first interval, the second interval, or both. In some examples, the error mask manager 830 may receive the error mask, where applying the error mask is based on the receiving. In some examples, the error mask manager 830 may correct one or more error bits in the first interval, the second interval, or both, based on applying the error mask, where successfully completing the decoding procedure for the data packet is based on correcting the one or more error bits.

The quantization band manager 835 may identify a first quantization band of the set of quantization bands where the one or more bits of an entropy symbol corresponding to the first quantization band satisfy a minimum impact threshold value.

Figure 9:
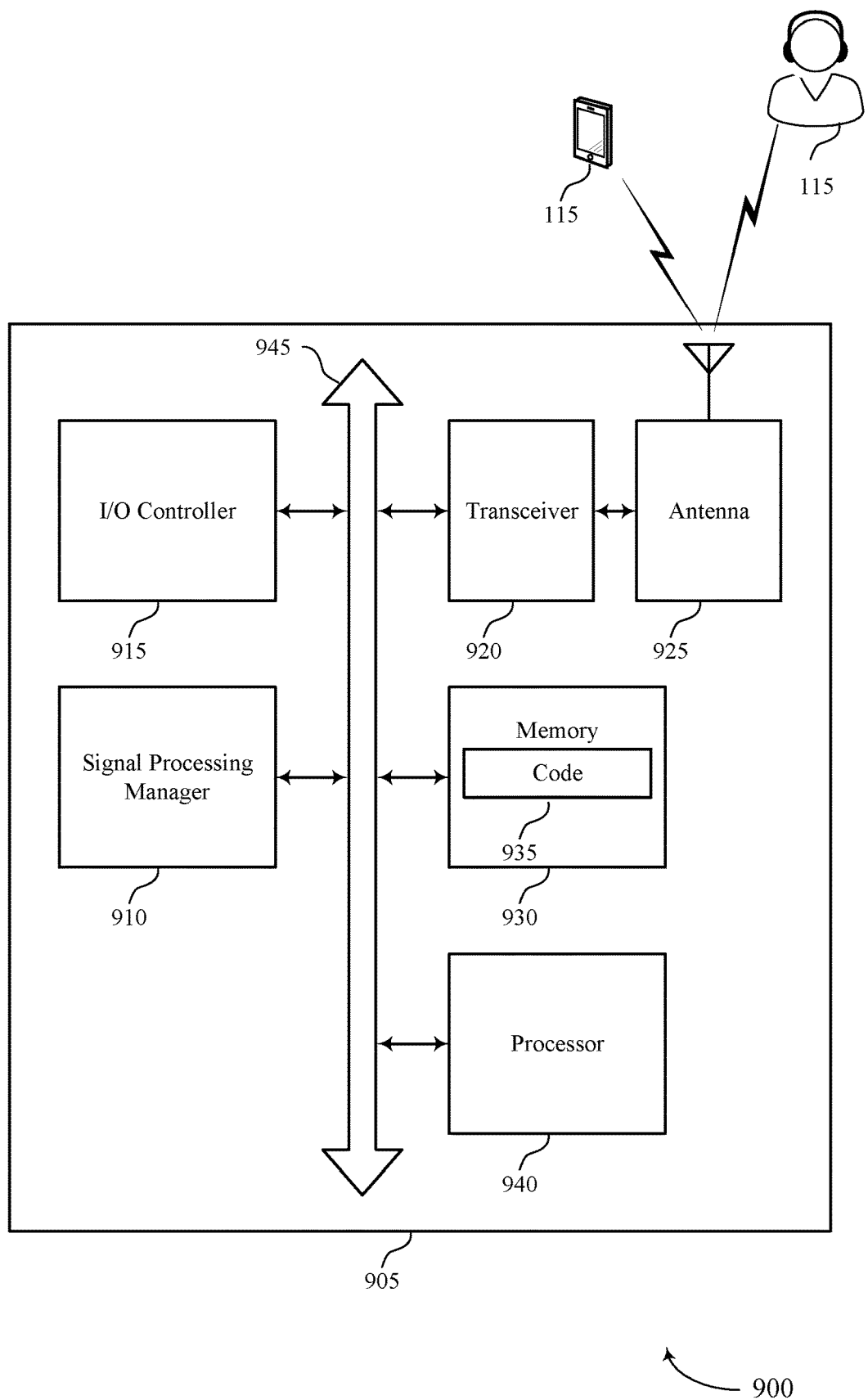
FIG. 9 shows a diagram of a system including a device that supports quantization codeword selection for low cost parity checking in accordance with aspects of the present disclosure.

FIG. 9 shows a diagram of a system 900 including a device 905 that supports quantization codeword selection for low cost parity checking in accordance with aspects of the present disclosure. The device 905 may be an example of or include the components of device 605, device 705, or a UE 115 as described herein. The device 905 may include components for bi-directional voice and data communications including components for transmitting and receiving communications, including a signal processing manager 910, an I/O controller 915, a transceiver 920, an antenna 925, memory 930, and a processor 940. These components may be in electronic communication via one or more buses (e.g., bus 945).

The signal processing manager 910 may receive a data packet including a set of intervals each having the same bit length and including one or more entropy symbols corresponding to one or more quantization bands, identify a first portion and a second portion of a first entropy symbol of the one or more entropy symbols, the first portion of the first entropy symbol in a first interval of the set of intervals and the second portion of the first entropy symbol in a second interval of the set of intervals, identify one bit for each interval of the data packet as a parity bit based on an indication of the identified parity bit included in the data packet, initiate a decoding procedure for the packet, where the length of each entropy symbol changes responsive to one or more encoding or decoding errors, successfully complete the decoding procedure for the data packet based on applying the error mask, determine, based on identifying the parity bit and identifying the first portion and the second portion of the first entropy symbol, that an error has occurred in encoding or decoding in the first interval and the second interval, and apply an error mask to the first interval, the second interval, or both.

The I/O controller 915 may manage input and output signals for the device 905. The I/O controller 915 may also manage peripherals not integrated into the device 905. In some cases, the I/O controller 915 may represent a physical connection or port to an external peripheral. In some cases, the I/O controller 915 may utilize an operating system such as iOS®, ANDROID®, MS-DOS®, MS-WINDOWS®, OS/2®, UNIX®, LINUX®, or another known operating system. In other cases, the I/O controller 915 may represent or interact with a modem, a keyboard, a mouse, a touchscreen, or a similar device. In some cases, the I/O controller 915 may be implemented as part of a processor. In some cases, a user may interact with the device 905 via the I/O controller 915 or via hardware components controlled by the I/O controller 915.

The transceiver 920 may communicate bi-directionally, via one or more antennas, wired, or wireless links as described above. For example, the transceiver 920 may represent a wireless transceiver and may communicate bi-directionally with another wireless transceiver. The transceiver 920 may also include a modem to modulate the packets and provide the modulated packets to the antennas for transmission, and to demodulate packets received from the antennas. The device 905 may communicate with one or more devices (e.g., a source device 115 (such as a user equipment (UE)), one or more audio devices 115, or the like).

In some cases, the wireless device may include a single antenna 925. However, in some cases the device may have more than one antenna 925, which may be capable of concurrently transmitting or receiving multiple wireless transmissions.

The memory 930 may include RAM and ROM. The memory 930 may store computer-readable, computer-executable code 935 including instructions that, when executed, cause the processor to perform various functions described herein. In some cases, the memory 930 may contain, among other things, a BIOS which may control basic hardware or software operation such as the interaction with peripheral components or devices.

The processor 940 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 940 may be configured to operate a memory array using a memory controller. In other cases, a memory controller may be integrated into the processor 940. The processor 940 may be configured to execute computer-readable instructions stored in a memory (e.g., the memory 930) to cause the device 905 to perform various functions (e.g., functions or tasks supporting quantization codeword selection for low cost parity checking).

The code 935 may include instructions to implement aspects of the present disclosure, including instructions to support wireless communications. The code 935 may be stored in a non-transitory computer-readable medium such as system memory or other type of memory. In some cases, the code 935 may not be directly executable by the processor 940 but may cause a computer (e.g., when compiled and executed) to perform functions described herein.

Figure 10:
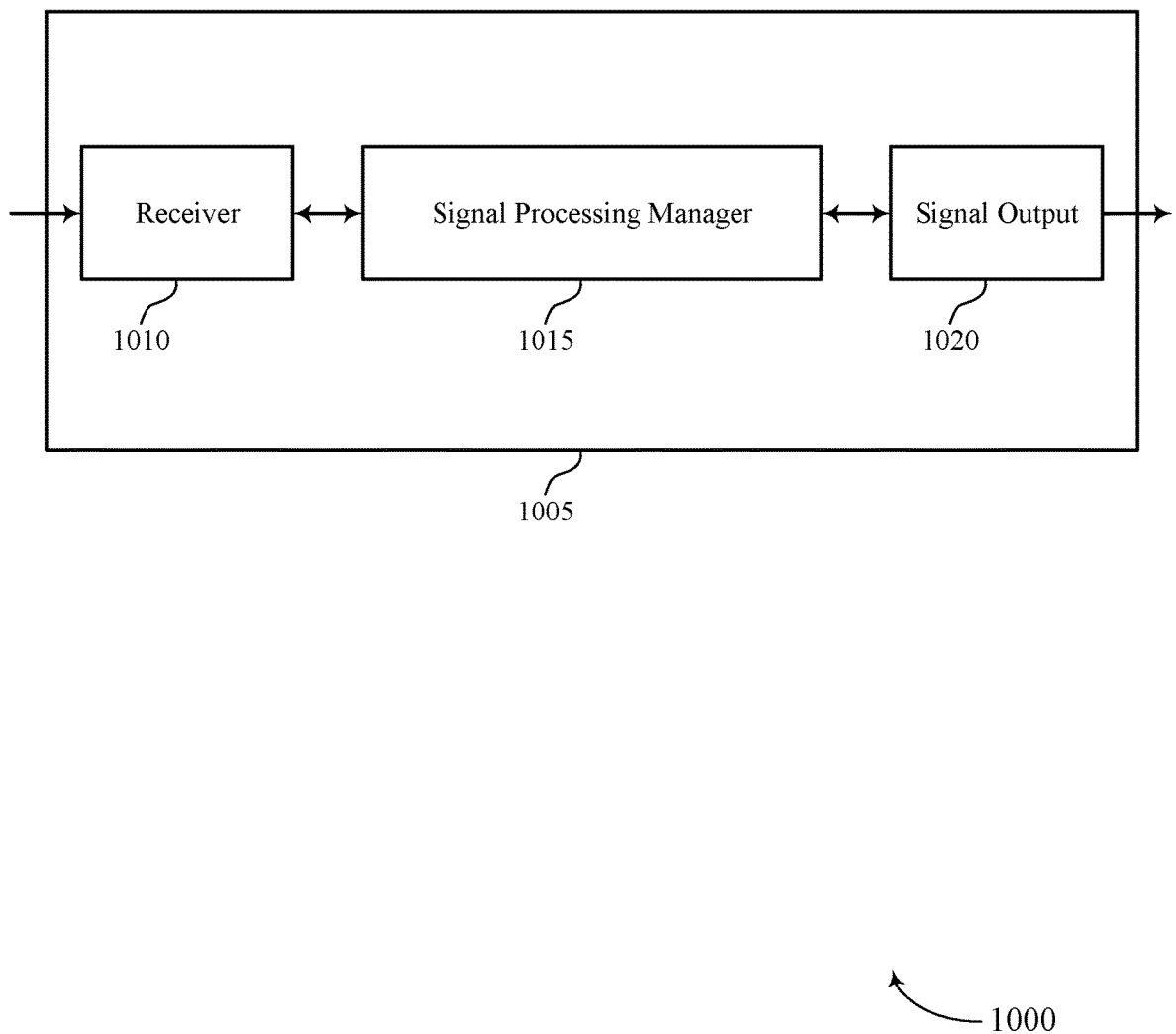
FIGS. 10 and 11 show block diagrams of devices that support quantization codeword selection for low cost parity checking in accordance with aspects of the present disclosure.

FIG. 10 shows a block diagram 1000 of a device 1005 that supports quantization codeword selection for low cost parity checking in accordance with aspects of the present disclosure. The device 1005 may be an example of aspects of a device as described herein. The device 1005 may include a signal input 1010, a signal processing manager 1015, and a transmitter 1020. The device 1005 may also include a processor. Each of these components may be in communication with one another (e.g., via one or more buses).

The signal input 1010 may receive information such as packets, user data, or control information associated with various information channels (e.g., control channels, data channels, and information related to quantization codeword selection for low cost parity checking, etc.). Information may be passed on to other components of the device 1005. The signal input 1010 may be an example of aspects of the transceiver 1320 described with reference to FIG. 13. The signal input 1010 may utilize a single antenna or a set of antennas.

The signal processing manager 1015 may generate one or more entropy symbols for each quantization band of a set of quantization bands, each entropy symbol including one or more bits of encoded data corresponding to a portion of an input signal in a respective quantization band, where the length of at least one of the one or more entropy symbols changes responsive to one or more encoding or decoding errors, stack the one or more entropy symbols into a set of intervals of a data packet, each interval having the same bit length, identify a first portion and a second portion of a first entropy symbol of the one or more entropy symbols that is in a first interval of the set of intervals, where the first portion is within a bit length of the first interval and the second portion is outside the bit length of the first interval, identify a second interval of the set of intervals, the one or more entropy symbols stacked in the second interval being shorter than a bit length of the second interval, allocate the second portion of the first entropy symbol to the second interval based on identifying the first portion and the second portion and identifying the second interval, select one bit of the one or more entropy symbols for each interval of the set of intervals as a parity bit for each respective interval, and transmit the data packet to a receiving device based on the allocating, where the data packet includes an indication of the selected parity bit. The signal processing manager 1015 may be an example of aspects of the signal processing manager 1310 described herein.

The signal processing manager 1015, or its sub-components, may be implemented in hardware, code (e.g., software or firmware) executed by a processor, or any combination thereof. If implemented in code executed by a processor, the functions of the signal processing manager 1015, or its sub-components may be executed by a general-purpose processor, a DSP, an application-specific integrated circuit (ASIC), a FPGA or other programmable logic device, discrete gate or transistor logic, discrete hardware components, or any combination thereof designed to perform the functions described in the present disclosure.

The signal processing manager 1015, or its sub-components, may be physically located at various positions, including being distributed such that portions of functions are implemented at different physical locations by one or more physical components. In some examples, the signal processing manager 1015, or its sub-components, may be a separate and distinct component in accordance with various aspects of the present disclosure. In some examples, the signal processing manager 1015, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

The signal output 1020 may output one or more processed audio signals generated or rendered by other components of the device 1005. For example, the transmitter 1020 may be an example of aspects of the transceiver 1320 described with reference to FIG. 13. The transmitter 1020 may utilize a single antenna or a set of antennas.

Figure 11:
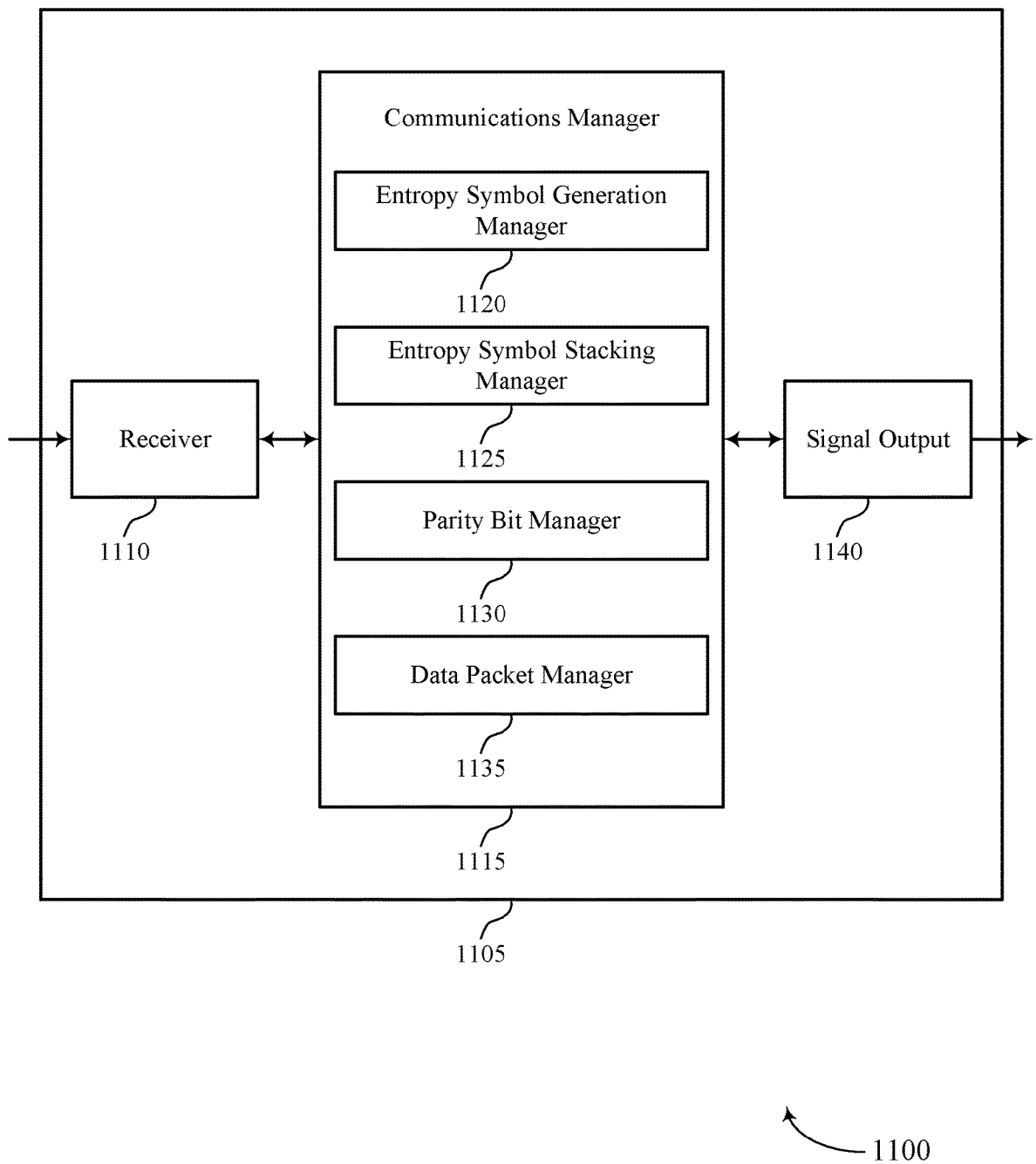

FIG. 11 shows a block diagram 1100 of a device 1105 that supports quantization codeword selection for low cost parity checking in accordance with aspects of the present disclosure. The device 1105 may be an example of aspects of a device 1005 or a device 115 as described herein. The device 1105 may include a signal input 1110, a signal processing manager 1115, and a transmitter 1140. The device 1105 may also include a processor. Each of these components may be in communication with one another (e.g., via one or more buses).

The receiver 1110 may receive information such as encoded packets, user data, or control information. Information may be passed on to other components of the device 1105. The receiver input 1110 may be an example of aspects of the transceiver 1320 described with reference to FIG. 13. The signal input 1110 may utilize a single antenna or a set of antennas.

The signal processing manager 1115 may be an example of aspects of the signal processing manager 1015 as described herein. The signal processing manager 1115 may include an entropy symbol generation manager 1120, an entropy symbol stacking manager 1125, a parity bit manager 1130, and a data packet manager 1135. The signal processing manager 1115 may be an example of aspects of the signal processing manager 1310 described herein.

The entropy symbol generation manager 1120 may generate one or more entropy symbols for each quantization band of a set of quantization bands, each entropy symbol including one or more bits of encoded data corresponding to a portion of an input signal in a respective quantization band, where the length of at least one of the one or more entropy symbols changes responsive to one or more encoding or decoding errors.

The entropy symbol stacking manager 1125 may stack the one or more entropy symbols into a set of intervals of a data packet, each interval having the same bit length, identify a first portion and a second portion of a first entropy symbol of the one or more entropy symbols that is in a first interval of the set of intervals, where the first portion is within a bit length of the first interval and the second portion is outside the bit length of the first interval, identify a second interval of the set of intervals, the one or more entropy symbols stacked in the second interval being shorter than a bit length of the second interval, and allocate the second portion of the first entropy symbol to the second interval based on identifying the first portion and the second portion and identifying the second interval.

The parity bit manager 1130 may select one bit of the one or more entropy symbols for each interval of the set of intervals as a parity bit for each respective interval.

The data packet manager 1135 may transmit the data packet to a receiving device based on the allocating, where the data packet includes an indication of the selected parity bit.

The transmitter 1140 may transmit signals generated by other components of the device 1105. In some examples, the signal output 1140 may be collocated with a signal input 1110 in a transceiver module. For example, the transmitter 1140 may be an example of aspects of the transceiver 1320 described with reference to FIG. 13.

Figure 12:
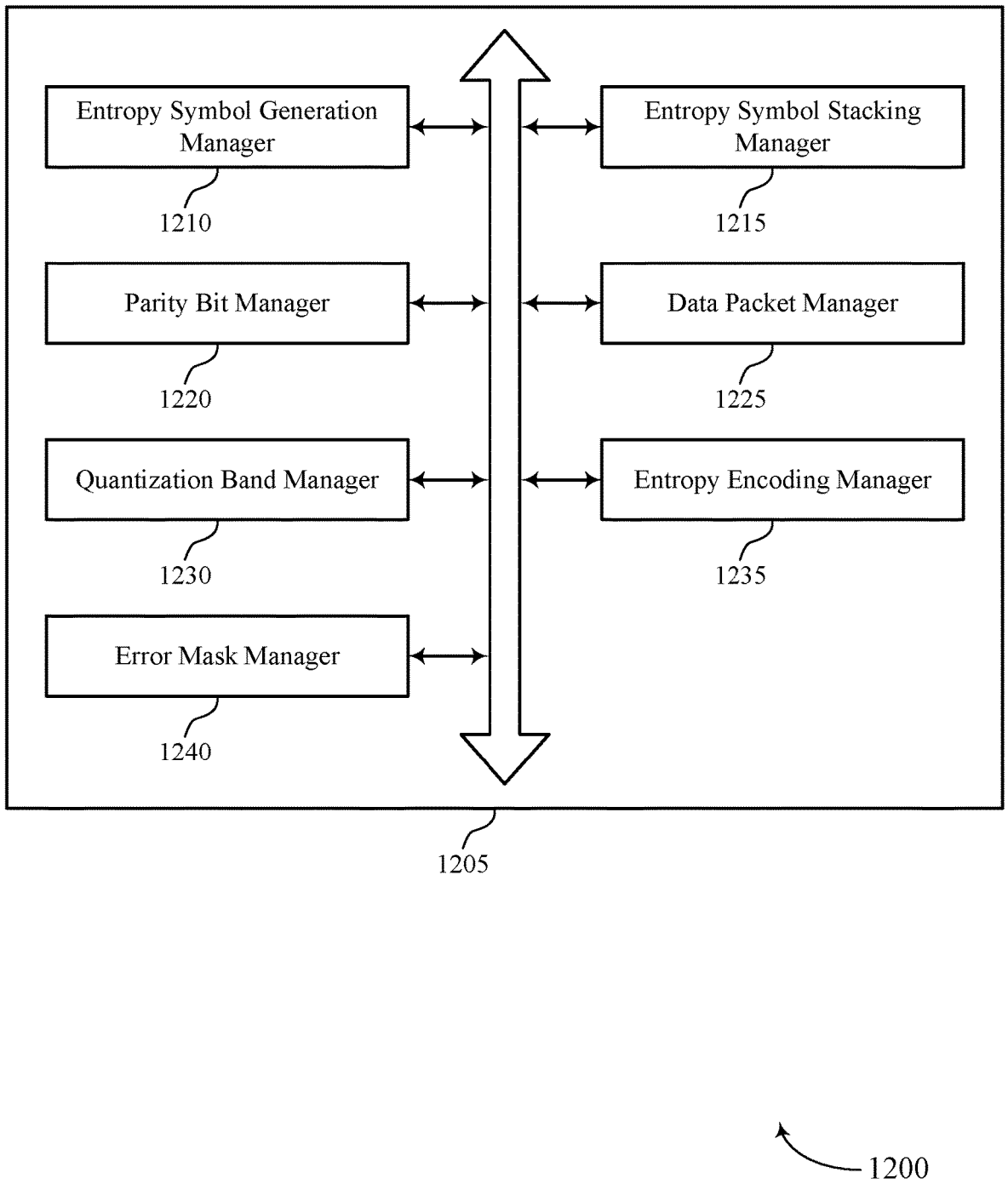
FIG. 12 shows a block diagram of a signal processing manager that supports quantization codeword selection for low cost parity checking in accordance with aspects of the present disclosure.

FIG. 12 shows a block diagram 1200 of a signal processing manager 1205 that supports quantization codeword selection for low cost parity checking in accordance with aspects of the present disclosure. The signal processing manager 1205 may be an example of aspects of a signal processing manager 1015, a signal processing manager 1115, or a signal processing manager 1310 described herein. The signal processing manager 1205 may include an entropy symbol generation manager 1210, an entropy symbol stacking manager 1215, a parity bit manager 1220, a data packet manager 1225, a quantization band manager 1230, an entropy encoding manager 1235, and an error mask manager 1240. Each of these modules may communicate, directly or indirectly, with one another (e.g., via one or more buses).

The entropy symbol generation manager 1210 may generate one or more entropy symbols for each quantization band of a set of quantization bands, each entropy symbol including one or more bits of encoded data corresponding to a portion of an input signal in a respective quantization band, where the length of at least one of the one or more entropy symbols changes responsive to one or more encoding or decoding errors.

The entropy symbol stacking manager 1215 may stack the one or more entropy symbols into a set of intervals of a data packet, each interval having the same bit length. In some examples, the entropy symbol stacking manager 1215 may identify a first portion and a second portion of a first entropy symbol of the one or more entropy symbols that is in a first interval of the set of intervals, where the first portion is within a bit length of the first interval and the second portion is outside the bit length of the first interval. In some examples, the entropy symbol stacking manager 1215 may identify a second interval of the set of intervals, the one or more entropy symbols stacked in the second interval being shorter than a bit length of the second interval.

In some examples, the entropy symbol stacking manager 1215 may allocate the second portion of the first entropy symbol to the second interval based on identifying the first portion and the second portion and identifying the second interval. In some examples, the entropy symbol stacking manager 1215 may pack at least one entropy symbol from each quantization band of the set of quantization bands into each interval of the plurality of intervals.

The parity bit manager 1220 may select one bit of the one or more entropy symbols for each interval of the set of intervals as a parity bit for each respective interval. In some examples, the parity bit manager 1220 may identify a least significant bit of the entropy symbol corresponding to the first quantization band. In some examples, the parity bit manager 1220 may select the least significant bit of the entropy symbol corresponding to the first quantization band as the parity bit for each of the one or more entropy symbols stacked in the same interval as the entropy symbol corresponding to the first quantization band. In some examples, the parity bit manager 1220 may add, to each of the set of intervals of the data packet, a new bit. In some examples, the parity bit manager 1220 may select each new bit as the parity bit for each respective interval.

The data packet manager 1225 may transmit the data packet to a receiving device based on the allocating, where the data packet includes an indication of the selected parity bit.

The quantization band manager 1230 may identify a first quantization band of the set of quantization bands where the one or more bits of an entropy symbol corresponding to the first quantization band satisfy a minimum impact threshold value. In some examples, the quantization band manager 1230 may divide available frequency spectrum corresponding to the input signal into a set of quantization bands, where each quantization band of the set of quantization bands is non-uniform.

The entropy encoding manager 1235 may compress, based on the dividing, the input signal into a bit stream including one or more codewords. In some examples, the entropy encoding manager 1235 may perform entropy encoding on the one or more codewords, where generating the one or more entropy symbols is based on the entropy encoding. In some examples, the entropy encoding manager 1235 may perform Huffman encoding on a bitstream corresponding to the input signal, where the one or more entropy symbols will increase in length if an error in encoding or decoding occurs based on the performed Huffman encoding. In some examples, the entropy encoding manager 1235 may generate a Huffman tree having a set of ordered branches, each ordered branch of the Huffman tree providing, to the receiving device, additional information regarding the length of an entropy symbol.

The error mask manager 1240 may transmit, to the receiving device, an error mask, where the error mask is based on the stacking and the allocating.

Figure 13:
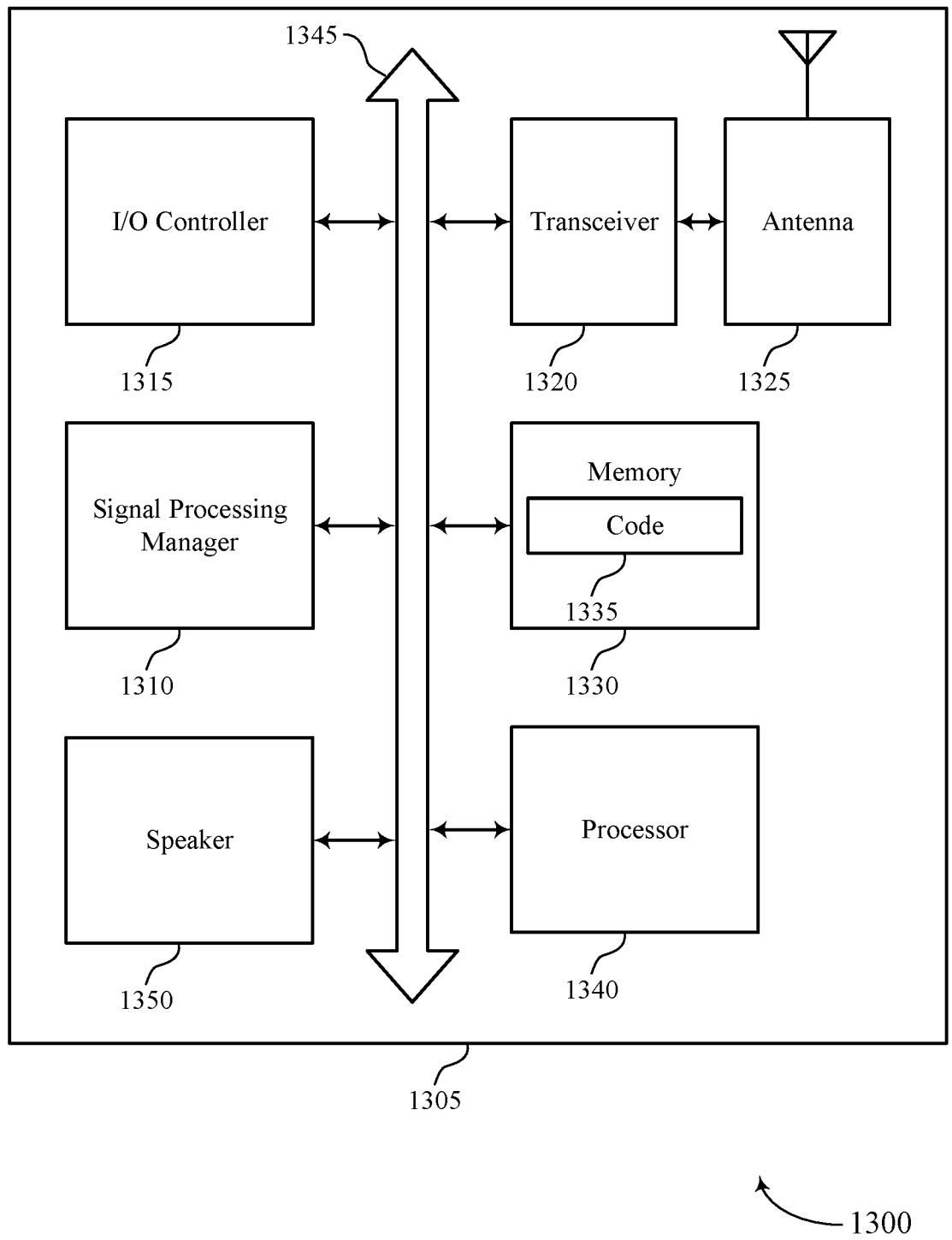
FIG. 13 shows a diagram of a system including a device that supports quantization codeword selection for low cost parity checking in accordance with aspects of the present disclosure.

FIG. 13 shows a diagram of a system 1300 including a device 1305 that supports quantization codeword selection for low cost parity checking in accordance with aspects of the present disclosure. The device 1305 may be an example of or include the components of device 1005, device 1105, or a device as described herein. The device 1305 may include components for bi-directional voice and data communications including components for transmitting and receiving communications, including a signal processing manager 1310, an I/O controller 1315, a transceiver 1320, an antenna 1325, memory 1330, a processor 1340, and a coding manager 1350. These components may be in electronic communication via one or more buses (e.g., bus 1345).

The signal processing manager 1310 may generate one or more entropy symbols for each quantization band of a set of quantization bands, each entropy symbol including one or more bits of encoded data corresponding to a portion of an input signal in a respective quantization band, where the length of at least one of the one or more entropy symbols changes responsive to one or more encoding or decoding errors, stack the one or more entropy symbols into a set of intervals of a data packet, each interval having the same bit length, identify a first portion and a second portion of a first entropy symbol of the one or more entropy symbols that is in a first interval of the set of intervals, where the first portion is within a bit length of the first interval and the second portion is outside the bit length of the first interval, identify a second interval of the set of intervals, the one or more entropy symbols stacked in the second interval being shorter than a bit length of the second interval, allocate the second portion of the first entropy symbol to the second interval based on identifying the first portion and the second portion and identifying the second interval, select one bit of the one or more entropy symbols for each interval of the set of intervals as a parity bit for each respective interval, and transmit the data packet to a receiving device based on the allocating, where the data packet includes an indication of the selected parity bit.

The I/O controller 1315 may manage input and output signals for the device 1305. The I/O controller 1315 may also manage peripherals not integrated into the device 1305. In some cases, the I/O controller 1315 may represent a physical connection or port to an external peripheral. In some cases, the I/O controller 1315 may utilize an operating system such as iOS®, ANDROID®, MS-DOS®, MS-WINDOWS®, OS/2®, UNIX®, LINUX®, or another known operating system. In other cases, the I/O controller 1315 may represent or interact with a modem, a keyboard, a mouse, a touchscreen, or a similar device. In some cases, the I/O controller 1315 may be implemented as part of a processor. In some cases, a user may interact with the device 1305 via the I/O controller 1315 or via hardware components controlled by the I/O controller 1315.

The transceiver 1320 may communicate bi-directionally, via one or more antennas, wired, or wireless links as described above. For example, the transceiver 1320 may represent a wireless transceiver and may communicate bi-directionally with another wireless transceiver (e.g., to receive encoded data packets from a transmitting device).

In some cases, the wireless device may include a single antenna 1325. However, in some cases the device may have more than one antenna 1325, which may be capable of concurrently transmitting or receiving multiple wireless transmissions.

The memory 1330 may include RAM and ROM. The memory 1330 may store computer-readable, computer-executable code 1335 including instructions that, when executed, cause the processor to perform various functions described herein. In some cases, the memory 1330 may contain, among other things, a BIOS which may control basic hardware or software operation such as the interaction with peripheral components or devices.

The processor 1340 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1340 may be configured to operate a memory array using a memory controller. In other cases, a memory controller may be integrated into the processor 1340. The processor 1340 may be configured to execute computer-readable instructions stored in a memory (e.g., the memory 1330) to cause the device 1305 to perform various functions (e.g., functions or tasks supporting quantization codeword selection for low cost parity checking).

The code 1335 may include instructions to implement aspects of the present disclosure, including instructions to support wireless communications. The code 1335 may be stored in a non-transitory computer-readable medium such as system memory or other type of memory. In some cases, the code 1335 may not be directly executable by the processor 1340 but may cause a computer (e.g., when compiled and executed) to perform functions described herein.

The speaker 1350 may output, for a user, a data stream including one or more decoded data packets.

Figure 14:
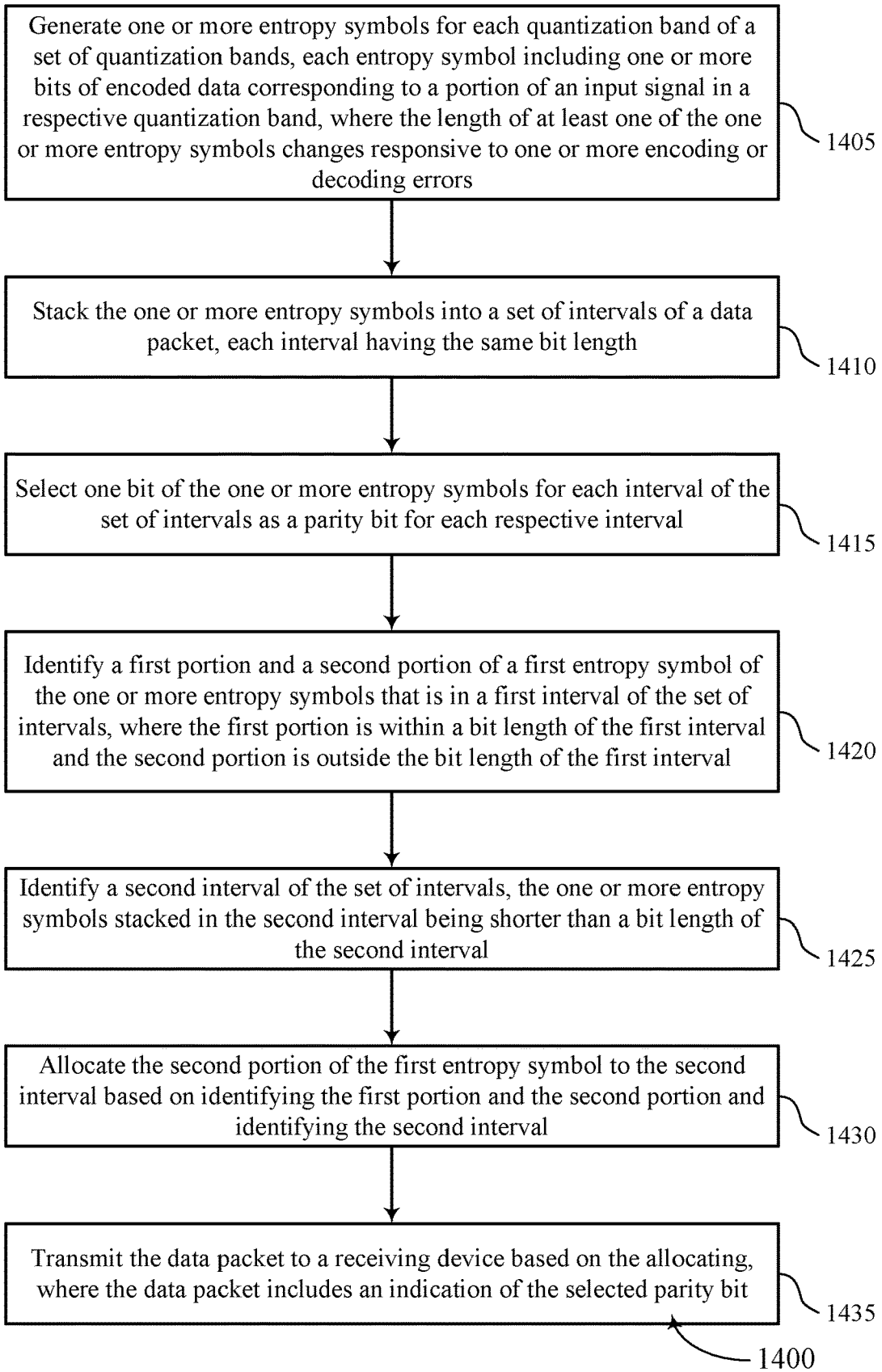
FIGS. 14 and 15 show flowcharts illustrating methods that support quantization codeword selection for low cost parity checking in accordance with aspects of the present disclosure.

FIG. 14 shows a flowchart illustrating a method 1400 that supports quantization codeword selection for low cost parity checking in accordance with aspects of the present disclosure. The operations of method 1400 may be implemented by a device or its components as described herein. For example, the operations of method 1400 may be performed by a signal processing manager as described with reference to FIGS. 10 through 13. In some examples, a device may execute a set of instructions to control the functional elements of the device to perform the functions described below. Additionally or alternatively, a device may perform aspects of the functions described below using special-purpose hardware.

At 1405, the device may generate one or more entropy symbols for each quantization band of a set of quantization bands, each entropy symbol including one or more bits of encoded data corresponding to a portion of an input signal in a respective quantization band, where the length of at least one of the one or more entropy symbols changes responsive to one or more encoding or decoding errors. The operations of 1405 may be performed according to the methods described herein. In some examples, aspects of the operations of 1405 may be performed by an entropy symbol generation manager as described with reference to FIGS. 10 through 13.

At 1410, the device may stack the one or more entropy symbols into a set of intervals of a data packet, each interval having the same bit length. The operations of 1410 may be performed according to the methods described herein. In some examples, aspects of the operations of 1410 may be performed by an entropy symbol stacking manager as described with reference to FIGS. 10 through 13.

At 1415, the device may select one bit of the one or more entropy symbols for each interval of the set of intervals as a parity bit for each respective interval. The operations of 1415 may be performed according to the methods described herein. In some examples, aspects of the operations of 1415 may be performed by a parity bit manager as described with reference to FIGS. 10 through 13.

At 1420, the device may identify a first portion and a second portion of a first entropy symbol of the one or more entropy symbols that is in a first interval of the set of intervals, where the first portion is within a bit length of the first interval and the second portion is outside the bit length of the first interval. The operations of 1420 may be performed according to the methods described herein. In some examples, aspects of the operations of 1420 may be performed by an entropy symbol stacking manager as described with reference to FIGS. 10 through 13.

At 1425, the device may identify a second interval of the set of intervals, the one or more entropy symbols stacked in the second interval being shorter than a bit length of the second interval. The operations of 1425 may be performed according to the methods described herein. In some examples, aspects of the operations of 1425 may be performed by an entropy symbol stacking manager as described with reference to FIGS. 10 through 13.

At 1430, the device may allocate the second portion of the first entropy symbol to the second interval based on identifying the first portion and the second portion and identifying the second interval. The operations of 1430 may be performed according to the methods described herein. In some examples, aspects of the operations of 1430 may be performed by an entropy symbol stacking manager as described with reference to FIGS. 10 through 13.

At 1435, the device may transmit the data packet to a receiving device based on the allocating, where the data packet includes an indication of the selected parity bit. The operations of 1435 may be performed according to the methods described herein. In some examples, aspects of the operations of 1435 may be performed by a data packet manager as described with reference to FIGS. 10 through 13.

Figure 15:
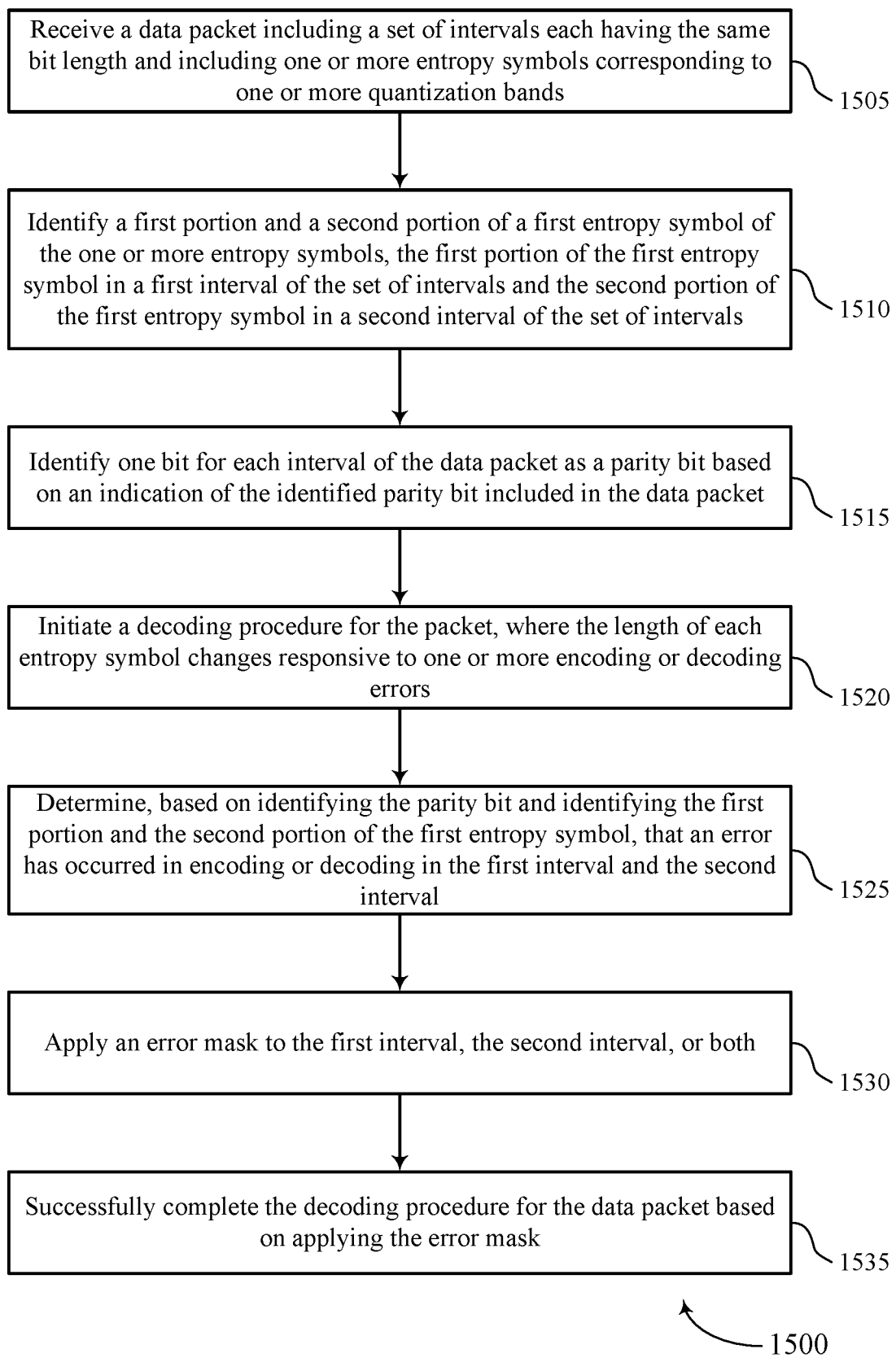

FIG. 15 shows a flowchart illustrating a method 1500 that supports quantization codeword selection for low cost parity checking in accordance with aspects of the present disclosure. The operations of method 1500 may be implemented by a UE 115 or its components as described herein. For example, the operations of method 1500 may be performed by a signal processing manager as described with reference to FIGS. 6 through 9. In some examples, a UE may execute a set of instructions to control the functional elements of the UE to perform the functions described below. Additionally or alternatively, a UE may perform aspects of the functions described below using special-purpose hardware.

At 1505, the UE may receive a data packet including a set of intervals each having the same bit length and including one or more entropy symbols corresponding to one or more quantization bands. The operations of 1505 may be performed according to the methods described herein. In some examples, aspects of the operations of 1505 may be performed by a data packet manager as described with reference to FIGS. 6 through 9.

At 1510, the UE may identify a first portion and a second portion of a first entropy symbol of the one or more entropy symbols, the first portion of the first entropy symbol in a first interval of the set of intervals and the second portion of the first entropy symbol in a second interval of the set of intervals. The operations of 1510 may be performed according to the methods described herein. In some examples, aspects of the operations of 1510 may be performed by an entropy symbol manager as described with reference to FIGS. 6 through 9.

At 1515, the UE may identify one bit for each interval of the data packet as a parity bit based on an indication of the identified parity bit included in the data packet. The operations of 1515 may be performed according to the methods described herein. In some examples, aspects of the operations of 1515 may be performed by a parity bit manager as described with reference to FIGS. 6 through 9.

At 1520, the UE may initiate a decoding procedure for the packet, where the length of each entropy symbol changes responsive to one or more encoding or decoding errors. The operations of 1520 may be performed according to the methods described herein. In some examples, aspects of the operations of 1520 may be performed by a decoding manager as described with reference to FIGS. 6 through 9.

At 1525, the UE may determine, based on identifying the parity bit and identifying the first portion and the second portion of the first entropy symbol, that an error has occurred in encoding or decoding in the first interval and the second interval. The operations of 1525 may be performed according to the methods described herein. In some examples, aspects of the operations of 1525 may be performed by an error mask manager as described with reference to FIGS. 6 through 9.

At 1530, the UE may apply an error mask to the first interval, the second interval, or both. The operations of 1530 may be performed according to the methods described herein. In some examples, aspects of the operations of 1530 may be performed by an error mask manager as described with reference to FIGS. 6 through 9.

At 1535, the UE may successfully complete the decoding procedure for the data packet based on applying the error mask. The operations of 1535 may be performed according to the methods described herein. In some examples, aspects of the operations of 1535 may be performed by a decoding manager as described with reference to FIGS. 6 through 9.

It should be noted that the methods described herein describe possible implementations, and that the operations and the steps may be rearranged or otherwise modified and that other implementations are possible. Further, aspects from two or more of the methods may be combined.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special purpose computer. By way of example, and not limitation, non-transitory computer-readable media may include random-access memory (RAM), read-only memory (ROM), electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for signal processing at a transmitting device, comprising:
   generating one or more entropy symbols for each quantization band of a plurality of quantization bands, each entropy symbol comprising one or more bits of encoded data corresponding to a portion of an input signal in a respective quantization band, wherein the length of at least one of the one or more entropy symbols changes responsive to one or more encoding or decoding errors;
   stacking the one or more entropy symbols into a plurality of intervals of a data packet, each interval having the same bit length;
   selecting one bit of the one or more entropy symbols for each interval of the plurality of intervals as a parity bit for each respective interval;
   identifying a first portion and a second portion of a first entropy symbol of the one or more entropy symbols that is in a first interval of the plurality of intervals, wherein the first portion is within a bit length of the first interval and the second portion is outside the bit length of the first interval;
   identifying a second interval of the plurality of intervals, the one or more entropy symbols stacked in the second interval being shorter than a bit length of the second interval;
   allocating the second portion of the first entropy symbol to the second interval based at least in part on identifying the first portion and the second portion and identifying the second interval; and
   transmitting the data packet to a receiving device based at least in part on the allocating, wherein the data packet includes an indication of the selected parity bit.

2. The method of claim 1, wherein selecting the one bit for each interval as the parity bit further comprises:
   identifying a first quantization band of the plurality of quantization bands wherein the one or more bits of an entropy symbol corresponding to the first quantization band satisfy a minimum impact threshold value;
   identifying a least significant bit of the entropy symbol corresponding to the first quantization band; and
   selecting the least significant bit of the entropy symbol corresponding to the first quantization band as the parity bit for each of the one or more entropy symbols stacked in the same interval as the entropy symbol corresponding to the first quantization band.

3. The method of claim 1, wherein selecting the one bit for each interval as the parity bit further comprises:
   adding, to each of the plurality of intervals of the data packet, a new bit; and
   selecting each new bit as the parity bit for each respective interval.

4. The method of claim 1, further comprising:
   compressing, based at least in part on the dividing, the input signal into a bit stream comprising one or more codewords; and
   performing entropy encoding on the one or more codewords, wherein
   generating the one or more entropy symbols is based at least in part on the entropy encoding.

5. The method of claim 1, further comprising:
   transmitting, to the receiving device, an error mask, wherein the error mask is based at least in part on the stacking and the allocating.

6. The method of claim 1, wherein generating the one or more entropy symbols further comprises:
   performing Huffman encoding on a bitstream corresponding to the input signal, wherein the one or more entropy symbols will increase in length if an error in encoding or decoding occurs based at least in part on the performed Huffman encoding.

7. The method of claim 6, wherein performing the Huffman encoding further comprises:
   generating a Huffman tree having a plurality of ordered branches, each ordered branch of the Huffman tree providing, to the receiving device, additional information regarding the length of an entropy symbol.

8. The method of claim 1, wherein packing the one or more entropy symbols into the plurality of intervals of the data packet further comprises:
   packing at least one entropy symbol from each quantization band of the plurality of quantization bands into each interval of the plurality of intervals.

9. The method of claim 1, further comprising:
   dividing available frequency spectrum corresponding to the input signal into a plurality of quantization bands, wherein each quantization band of the plurality of quantization bands is non-uniform.

10. A method for signal processing at a receiving device, comprising:
    receiving a data packet comprising a plurality of intervals each having the same bit length and comprising one or more entropy symbols corresponding to one or more quantization bands;
    identifying a first portion and a second portion of a first entropy symbol of the one or more entropy symbols, the first portion of the first entropy symbol in a first interval of the plurality of intervals and the second portion of the first entropy symbol in a second interval of the plurality of intervals;
    identifying one bit for each interval of the data packet as a parity bit based at least in part on an indication of the identified parity bit included in the data packet;
    initiating a decoding procedure for the packet, wherein the length of each entropy symbol changes responsive to one or more encoding or decoding errors;
    determining, based at least in part on identifying the parity bit and identifying the first portion and the second portion of the first entropy symbol, that an error has occurred in encoding or decoding in the first interval and the second interval;
    applying an error mask to the first interval, the second interval, or both; and
    successfully completing the decoding procedure for the data packet based at least in part on applying the error mask.

11. The method of claim 10, wherein determining that an error has occurred further comprises:
    determining, based at least in part on checking the parity of each interval, that the length of the first portion of the first entropy symbol has changed, based on two or more error bits located in the first entropy symbol;

determining, based at least in part on determining that the length of the first portion of the first entropy symbol has changed, that the length of the second portion of the first entropy symbol has changed; and determining, based at least in part on the determined change in the length of the first portion of the first entropy symbol, the second portion of the first entropy symbol, or both, that the two or more error bits are located in the first interval, the second interval, or both, wherein applying the error mask is based at least in part on determining that the two or more error bits are located in the first interval, the second interval, or both.

12. The method of claim 11, wherein:

determining that the length of the first portion of the first entropy symbol has changed, determining that the length of the second portion of the first entropy symbol has changed, or both, are based at least in part on a decoding a Huffman tree.

13. The method of claim 12, wherein the Huffman tree comprises a plurality of ordered branches, each ordered branch of the Huffman tree providing to the receiving device additional information regarding the length of an entropy symbol.

14. The method of claim 10, further comprising:

identifying a first quantization band of the plurality of quantization bands wherein the one or more bits of an entropy symbol corresponding to the first quantization band satisfy a minimum impact threshold value;

identifying a least significant bit of the entropy symbol corresponding to the first quantization band; and selecting the least significant bit of the entropy symbol corresponding to the first quantization band as the parity bit for all entropy symbols stacked in the same interval as the entropy symbol corresponding to the first quantization band, wherein identifying the one bit for each interval of the data packet as the parity bit is based at least in part on the selecting.

15. The method of claim 10, further comprising:

receiving the error mask, wherein applying the error mask is based at least in part on the receiving.

16. The method of claim 10, wherein each interval of the plurality of intervals comprises at least one entropy symbol from each quantization band of the plurality of quantization bands.

17. The method of claim 10, further comprising:

checking each interval for parity based at least in part on the identified parity bit and the decoding, wherein determining that an error has occurred in encoding or decoding in the first interval and the second interval is based at least in part on the checking.

18. The method of claim 10, further comprising:

correcting one or more error bits in the first interval, the second interval, or both, based at least in part on applying the error mask, wherein successfully completing the decoding procedure for the data packet is based at least in part on correcting the one or more error bits.

19. An apparatus for signal processing at a transmitting device, comprising:

a processor, memory coupled with the processor; and instructions stored in the memory and executable by the processor to cause the apparatus to:

generate one or more entropy symbols for each quantization band of a plurality of quantization bands, each entropy symbol comprising one or more bits of encoded data corresponding to a portion of an input signal in a respective quantization band, wherein the length of at least one of the one or more entropy symbols changes responsive to one or more encoding or decoding errors;

stack the one or more entropy symbols into a plurality of intervals of a data packet, each interval having the same bit length;

select one bit of the one or more entropy symbols for each interval of the plurality of intervals as a parity bit for each respective interval;

identify a first portion and a second portion of a first entropy symbol of the one or more entropy symbols that is in a first interval of the plurality of intervals, wherein the first portion is within a bit length of the first interval and the second portion is outside the bit length of the first interval;

identify a second interval of the plurality of intervals, the one or more entropy symbols stacked in the second interval being shorter than a bit length of the second interval;

allocate the second portion of the first entropy symbol to the second interval based at least in part on identifying the first portion and the second portion and identifying the second interval; and transmit the data packet to a receiving device based at least in part on the allocating, wherein the data packet includes an indication of the selected parity bit.

20. The apparatus of claim 19, wherein the instructions to select the one bit for each interval as the parity bit further are executable by the processor to cause the apparatus to:

identify a first quantization band of the plurality of quantization bands wherein the one or more bits of an entropy symbol corresponding to the first quantization band satisfy a minimum impact threshold value;

identify a least significant bit of the entropy symbol corresponding to the first quantization band; and select the least significant bit of the entropy symbol corresponding to the first quantization band as the parity bit for each of the one or more entropy symbols stacked in the same interval as the entropy symbol corresponding to the first quantization band.

* * * * *